US008223556B2

(12) United States Patent
Dutta et al.

(10) Patent No.: US 8,223,556 B2
(45) Date of Patent: Jul. 17, 2012

(54) PROGRAMMING NON-VOLATILE MEMORY WITH A REDUCED NUMBER OF VERIFY OPERATIONS

(75) Inventors: Deepanshu Dutta, Santa Clara, CA (US); Gerrit Jan Hemink, Yokohama (JP)

(73) Assignee: SanDisk Technologies Inc., Plano, TX (US)

(*) Notice: Subject to any disclaimer, the term of this patent is extended or adjusted under 35 U.S.C. 154(b) by 357 days.

(21) Appl. No.: 12/625,883

(22) Filed: Nov. 25, 2009

(65) Prior Publication Data

US 2011/0122692 A1 May 26, 2011

(51) Int. Cl.
*G11C 16/06* (2006.01)
(52) U.S. Cl. ......... 365/185.22; 365/185.03; 365/185.19; 365/185.24
(58) Field of Classification Search ............. 365/185.22, 365/185.03, 185.19, 185.24
See application file for complete search history.

(56) References Cited

U.S. PATENT DOCUMENTS

| | | | |
|---|---|---|---|
| 6,005,805 A | 12/1999 | Takeuchi | |
| 7,224,614 B1 | 5/2007 | Chan | |
| 7,301,817 B2 * | 11/2007 | Li et al. ................. | 365/185.22 |
| 7,304,893 B1 | 12/2007 | Hemink | |
| 7,366,022 B2 | 4/2008 | Li | |
| 7,457,144 B2 | 11/2008 | Kux | |
| 7,525,838 B2 | 4/2009 | Jung | |
| 7,564,718 B2 | 7/2009 | Seidel | |
| 2007/0177428 A1 | 8/2007 | Cohen | |
| 2008/0094911 A1 | 4/2008 | Chan | |
| 2008/0198662 A1 | 8/2008 | Mokhlesi | |
| 2009/0147573 A1 | 6/2009 | Hemink | |

FOREIGN PATENT DOCUMENTS

| | | |
|---|---|---|
| EP | 1881504 A2 | 1/2008 |
| WO | WO 2007/076512 A2 | 7/2007 |

OTHER PUBLICATIONS

Chang, A 48nm 32Gb 8-Level NAND Flash Memory with 5.5MB/s Program Throughput, ISSCC 2009, Session 13, Flash Memory 13.3, 2009 IEEE International Solid-State Circuits Conference.
International Search Report & the Written Opinion of the International Searching Authority dated Feb. 4, 2011, Patent Cooperation Treaty, International Application No. PCT/US2010/057666 filed Nov. 22, 2010.

* cited by examiner

*Primary Examiner* — Hoai V Ho
*Assistant Examiner* — Pablo Huerta
(74) *Attorney, Agent, or Firm* — Vierra Magen Marcus & DeNiro LLP

(57) ABSTRACT

A method and non-volatile storage system are provided in which programming speed is increased by reducing the number of verify operations, while maintaining a narrow threshold voltage distribution. A programming scheme performs a verify operation at an offset level, before a verify level of a target data state is reached, such as to slow down programming. However, it is not necessary to perform verify operations at both the offset and target levels at all times. In a first programming phase, verify operations are performed for a given data state only at the target verify level. In a second programming phase, verify operations are performed for offset and target verify levels. In a third programming phase, verify operations are again performed only at the target verify level. Transitions between phases can be predetermined, based on programming pulse number, or adaptive.

27 Claims, 17 Drawing Sheets

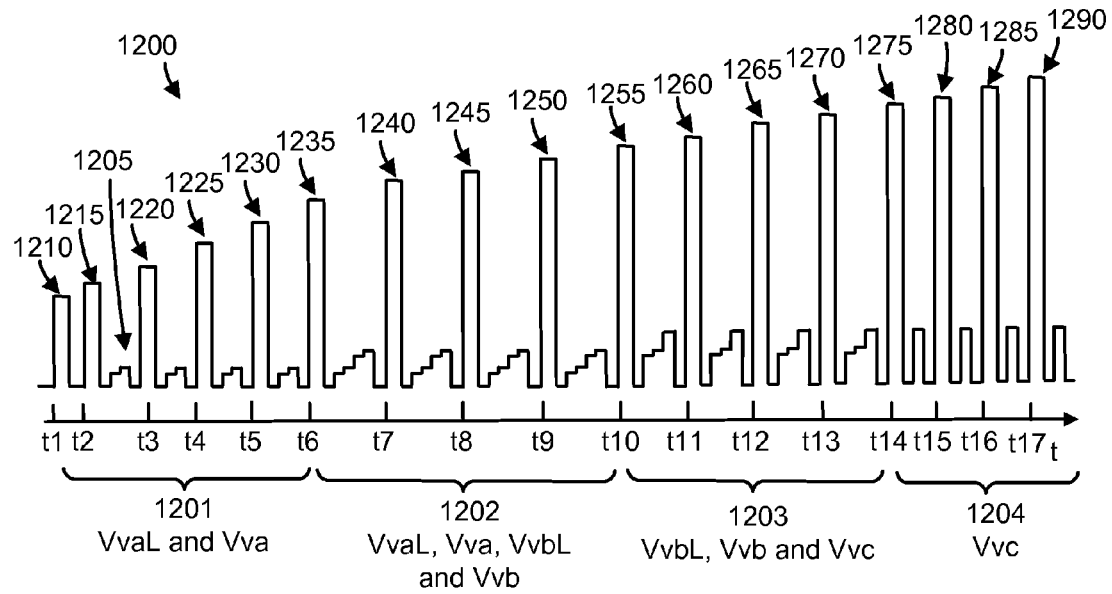
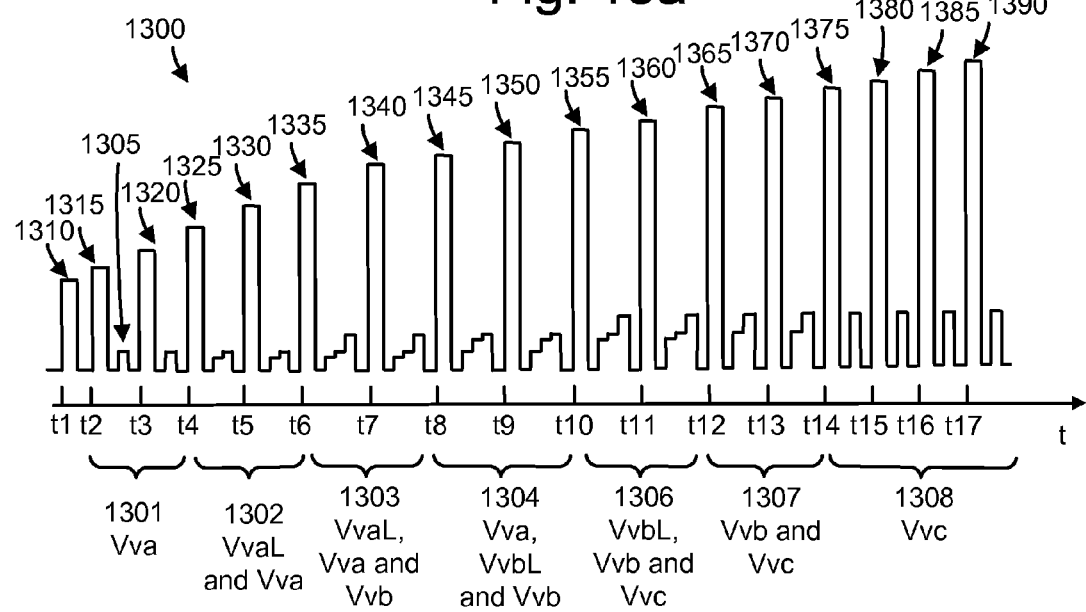

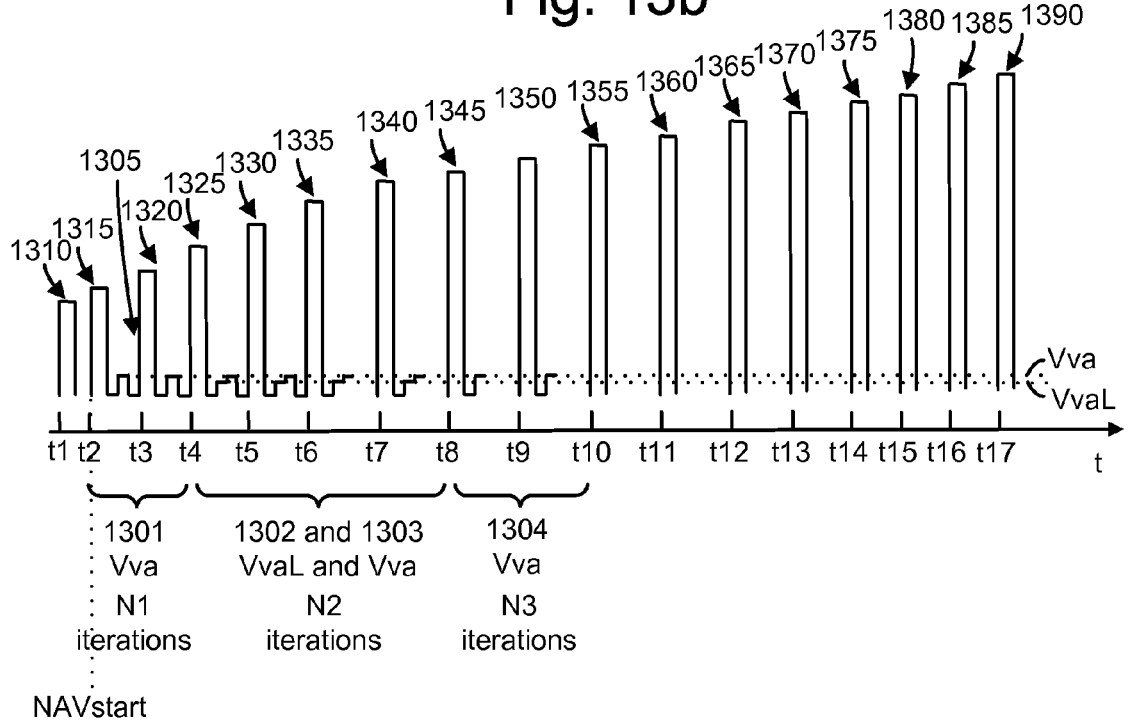
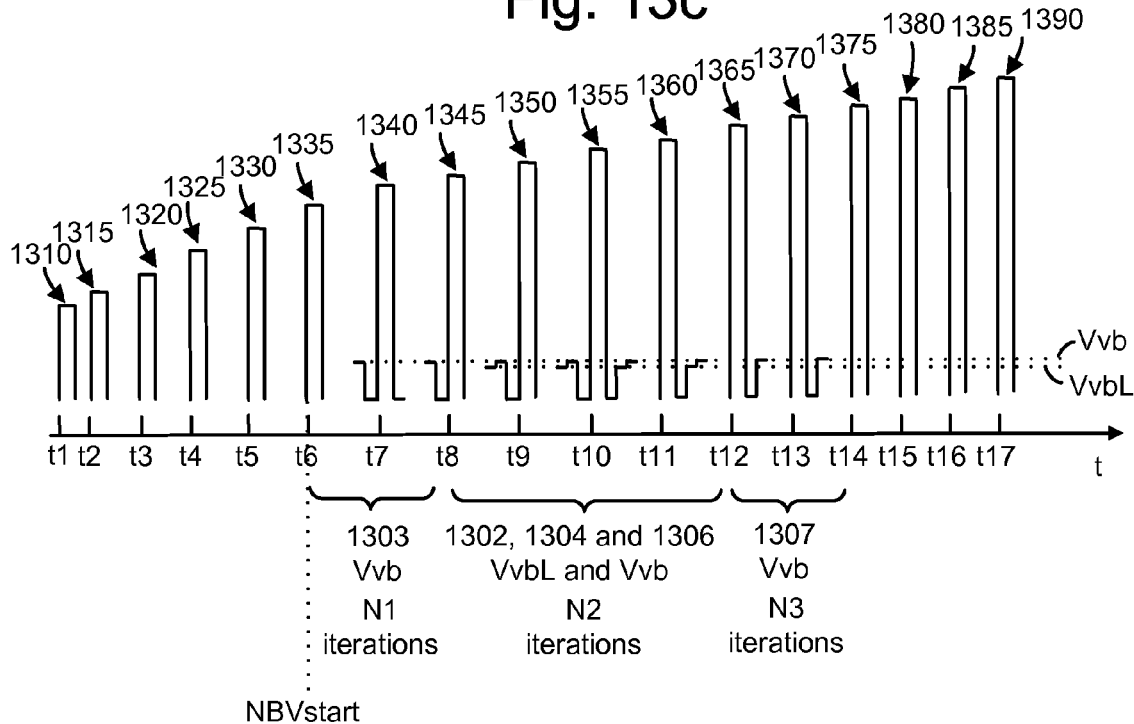

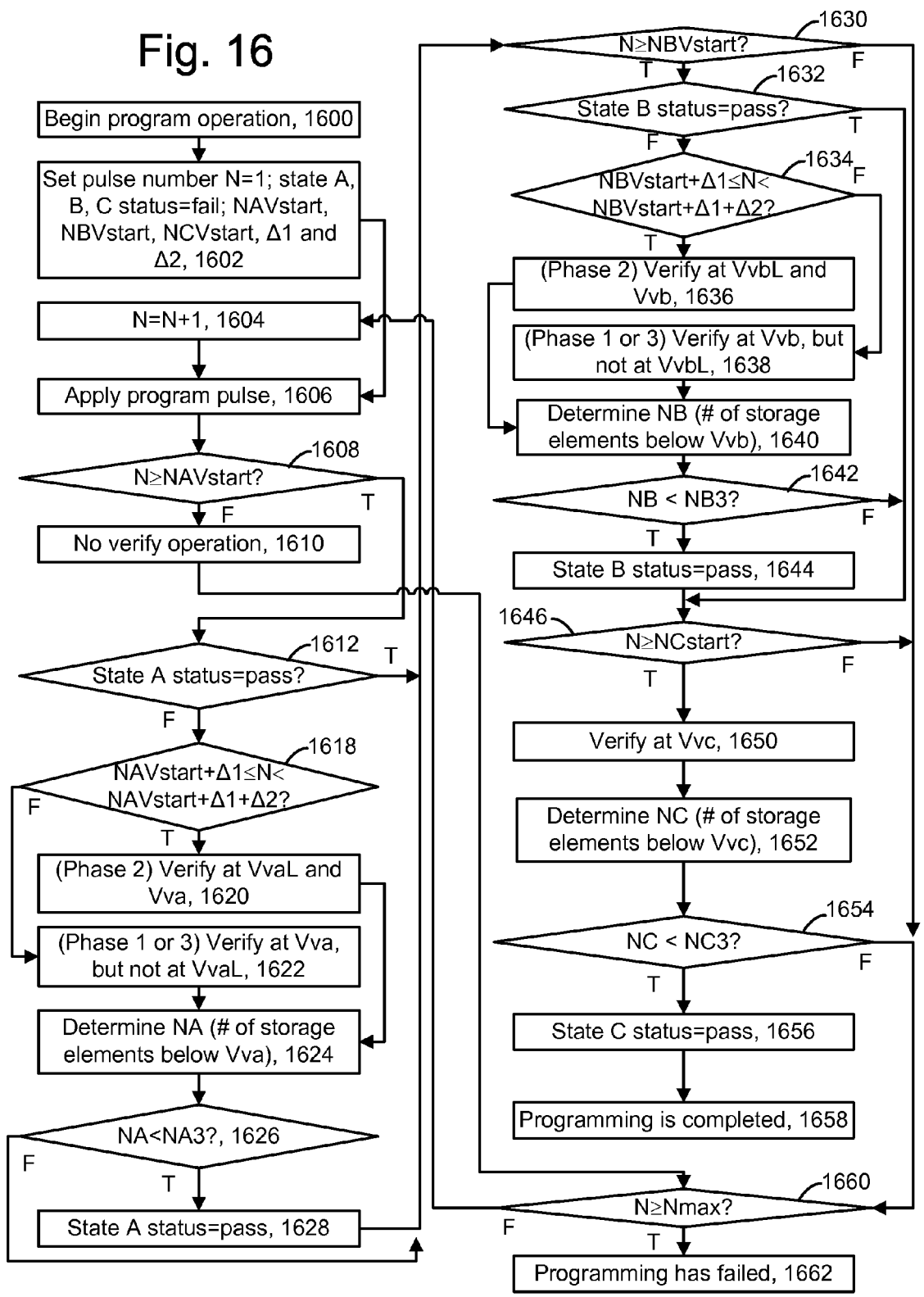

PROGRAMMING NON-VOLATILE MEMORY WITH A REDUCED NUMBER OF VERIFY OPERATIONS

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the element can be placed in one of four discrete charge bands corresponding to four distinct threshold voltage ranges.

Typically, a program voltage Vpgm applied to the control gate during a program operation is applied as a series of pulses that increase in magnitude over time. The program voltage can be applied to a selected word line. In one possible approach, the magnitude of the pulses is increased with each successive pulse by a predetermined step size, e.g., 0.2-0.4 V. Vpgm can be applied to the control gates of flash memory elements. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

Due to marketplace demands, there is a continuing need to increase programming speed while also achieving narrow threshold voltage distributions.

BRIEF DESCRIPTION OF THE DRAWINGS

FIG. 9b depicts a cumulative percentage of storage elements relative for different scanned portions of the natural programmed threshold voltage distribution of FIG. 9a.

FIG. 12 depicts a programming operation involving data states A, B and C, where offset and target verify operations are performed for each of states A and B, and a target verify operation is performed for state C.

FIG. 13a depicts a programming operation involving data states A, B and C, where: (a) for each of states A and B, a target verify operation is initially performed followed by offset and target verify operations, followed by a target verify operation, and (b) for state C, a target verify operation is performed.

FIG. 13b depicts the programming operation of FIG. 13a showing only A-state verify operations.

FIG. 13c depicts the programming operation of FIG. 13a showing only B-state verify operations.

FIG. 16 depicts the programming process of FIG. 10a in which the timing of phase 2 is based on predetermined criteria.

DETAILED DESCRIPTION

A method and non-volatile storage system are provided in which programming speed is increased by reducing the number of verify operations, while maintaining a narrow threshold voltage distribution.

One example of a suitable non-volatile storage system uses the NAND flash memory structure, which arranges multiple transistors in series between two select gates. The transistors in series and the select gates are referred to as a NAND string. For example, see US patent pub. 2009/0147573, published Jun. 11, 2009, and incorporated herein by reference. Other types of non-volatile memory in addition to NAND flash memory can also be used.

For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 1:
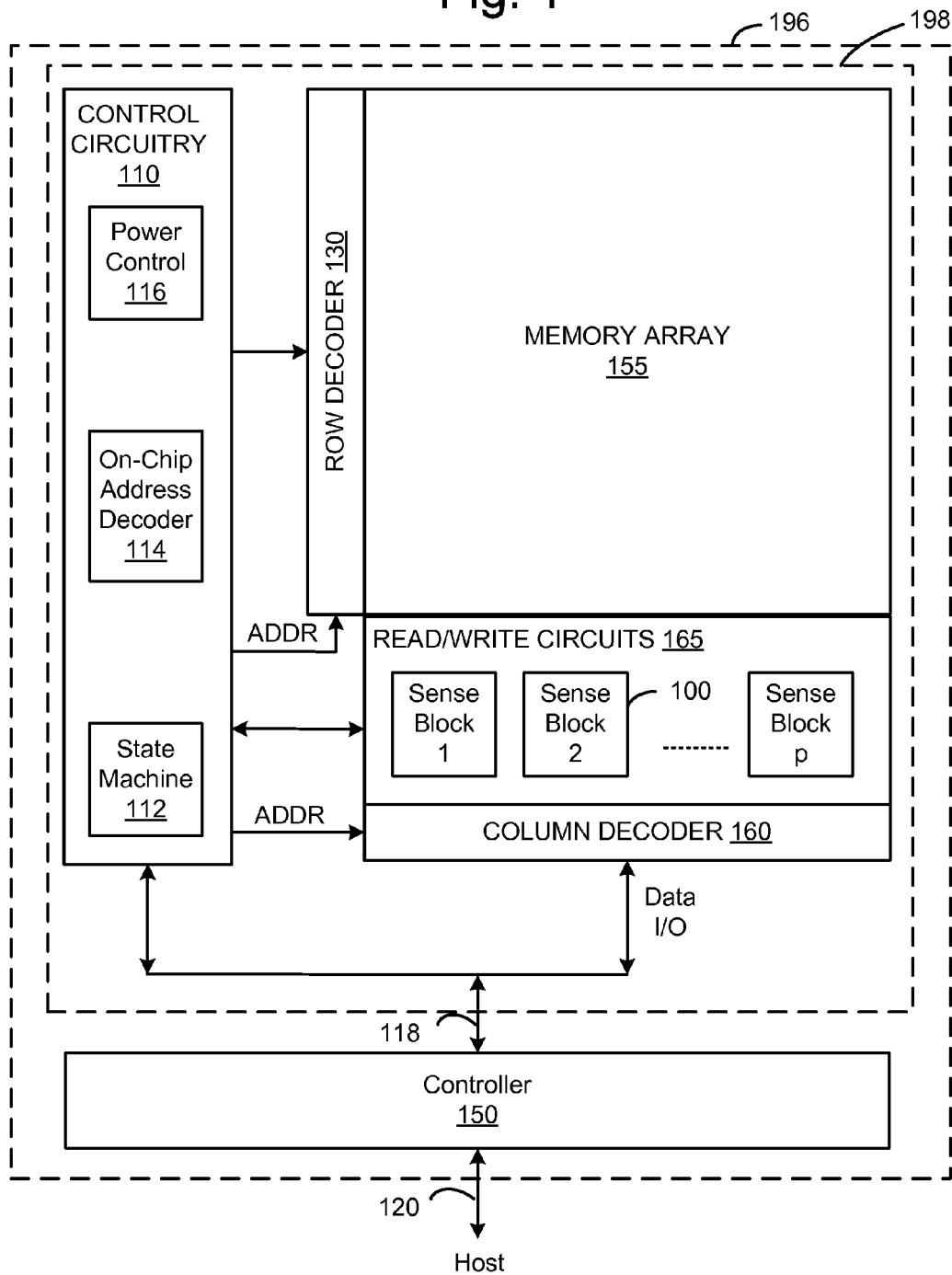
FIG. 1 is a block diagram of a non-volatile memory system using single row/column decoders and read/write circuits.

FIG. 1 is a block diagram of a non-volatile memory system using single row/column decoders and read/write circuits. The diagram illustrates a memory device 196 having read/write circuits for reading and programming a page of storage elements in parallel, according to one embodiment. Memory device 196 may include one or more memory die 198. Memory die 198 includes a two-dimensional array of storage elements 155, control circuitry 110, and read/write circuits 165. In some embodiments, the array of storage elements can be three dimensional. The memory array 155 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 196 (e.g., a removable storage card) as the one or more memory die 198. Commands and Data are transferred between the host and controller 150 via lines 120 and between the controller and the one or more memory die 198 via lines 118.

The control circuitry 110 cooperates with the read/write circuits 165 to perform memory operations on the memory array 155. The control circuitry 110 includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations.

In some implementations, some of the components of FIG. 1 can be combined. In various designs, one or more of the components (alone or in combination), other than storage element array 155, can be thought of as a managing or control circuit. For example, one or more managing or control circuits may include any one of or a combination of control circuitry 110, state machine 112, decoders 114/160, power control 116, sense blocks 100, read/write circuits 165, controller 150, etc.

In another embodiment, a non-volatile memory system uses dual row/column decoders and read/write circuits. Access to the memory array 155 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

Figure 2:
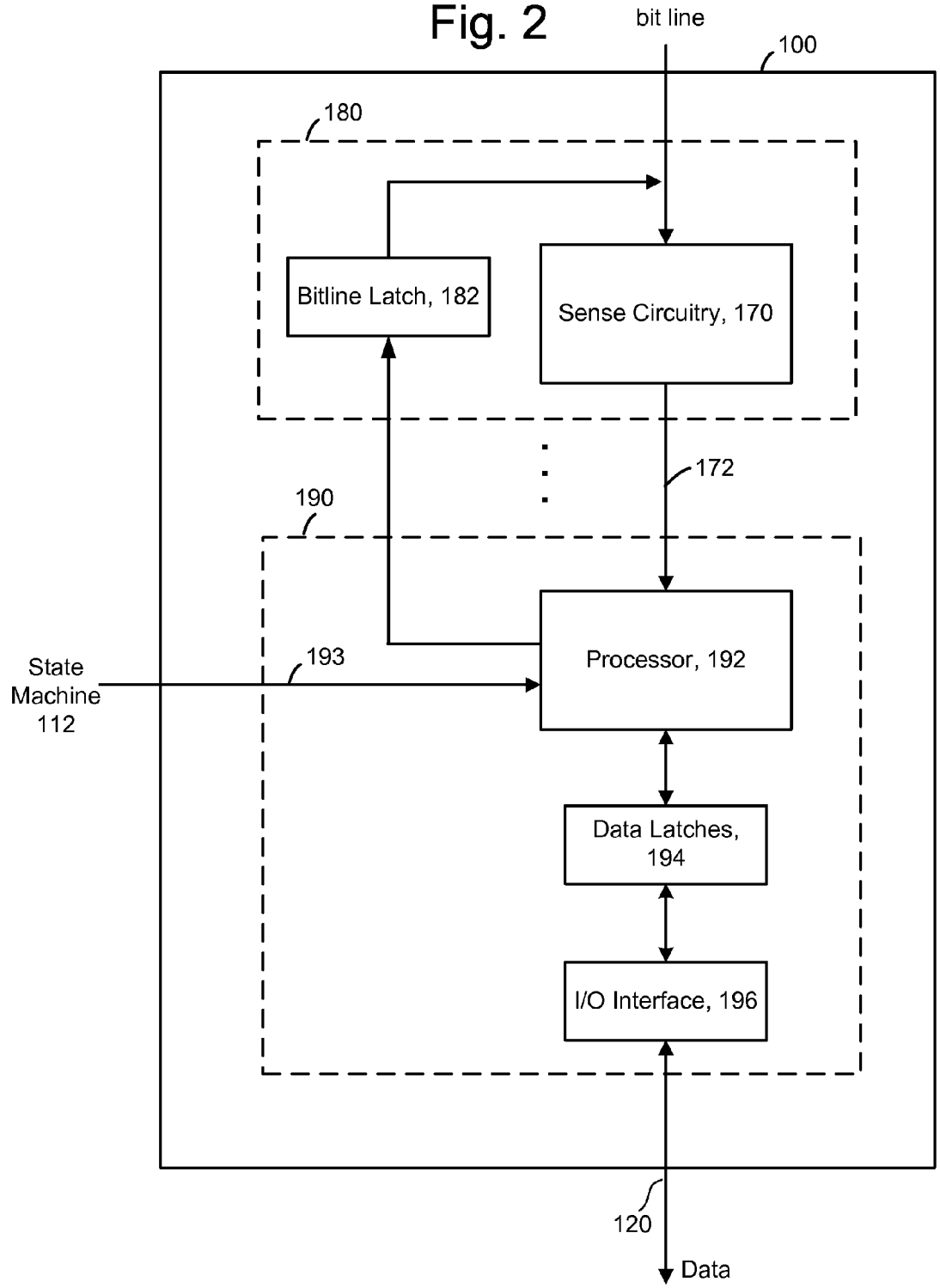
FIG. 2 is a block diagram depicting one embodiment of a sense block.

FIG. 2 is a block diagram depicting one embodiment of a sense block. An individual sense block 100 is partitioned into a core portion, referred to as a sense module 180, and a common portion 190. In one embodiment, there will be a separate sense module 180 for each bit line and one common portion 190 for a set of multiple sense modules 180. In one example, a sense block will include one common portion 190 and eight sense modules 180. Each of the sense modules in a group communicates with the associated common portion via data bus 172.

Sense module 180 comprises sense circuitry 170 that determines whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V).

Common portion 190 comprises a processor 192, a set of data latches 194 and an I/O Interface 196 coupled between the set of data latches 194 and data bus 120. Processor 192 performs computations. For example, one of its functions is to determine the data stored in the sensed storage element and store the determined data in the set of data latches. The set of data latches 194 is used to store data bits determined by processor 192 during a read operation. It is also used to store data bits imported from the data bus 120 during a program operation. The imported data bits represent write data meant to be programmed into the memory. I/O interface 196 provides an interface between data latches 194 and the data bus 120. See also FIG. 15 regarding data which can be stored in latches for use in determining what verify operations to perform during a programming operation.

During read or sensing, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and an output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194. In another embodiment of the core portion, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 194 from the data bus 120. The program operation, under the control of the state machine, comprises a series of programming voltage pulses applied to the control gates of the addressed storage elements. Each program pulse is followed by a read back (verify) to determine if the storage element has been programmed to the desired memory state. Processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Data latch stack 194 contains a stack of data latches corresponding to the sense module. In one embodiment, there are three data latches per sense module 180. In some implementations (but not required), the data latches are implemented as a shift register so that the parallel data stored therein is converted to serial data for data bus 120, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 3:
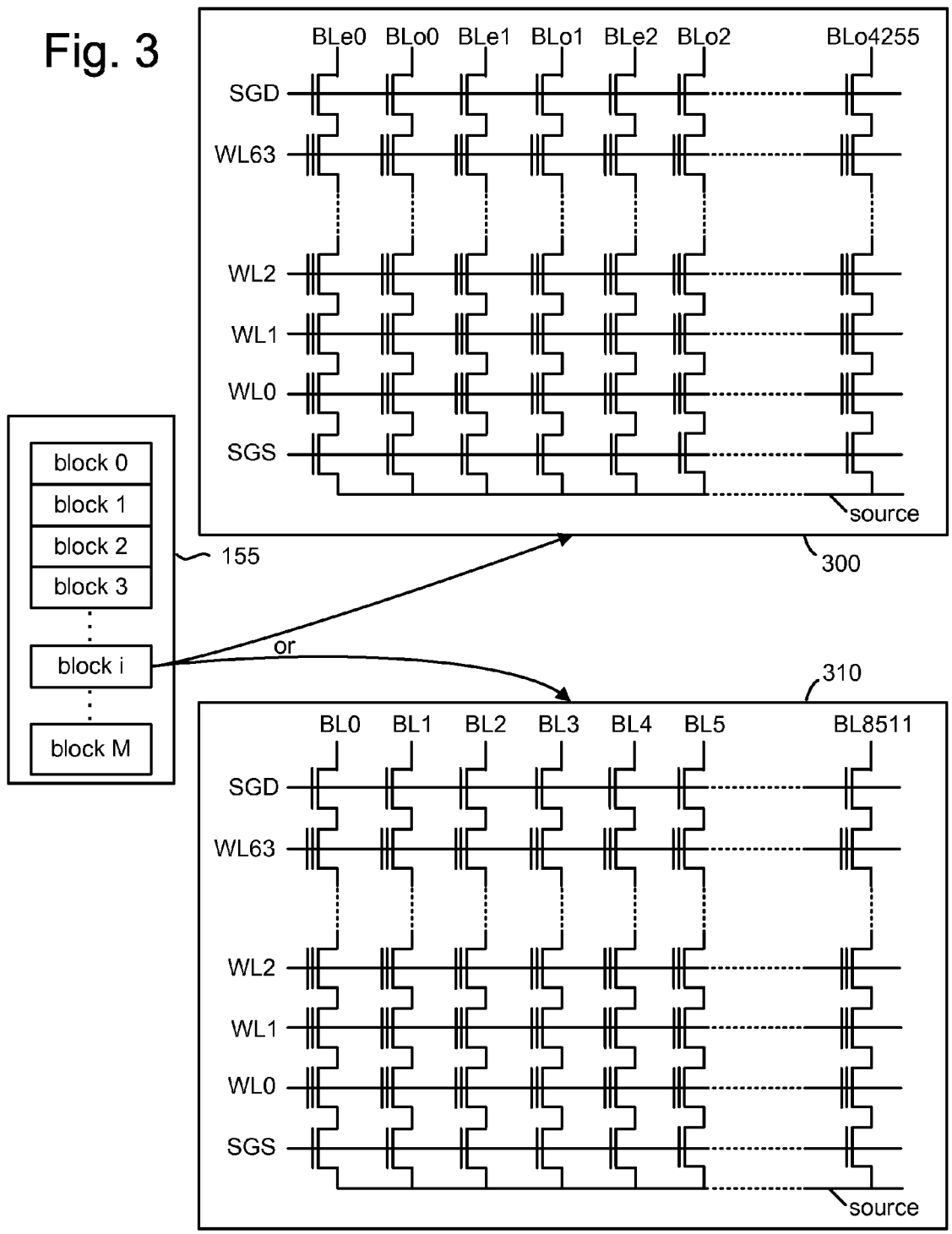
FIG. 3 illustrates an example of an organization of a memory array into blocks for an all bit line memory architecture or for an odd-even memory architecture.

FIG. 3 illustrates an example of an organization of a memory array into blocks for an all bit line memory architecture or for an odd-even memory architecture. Exemplary structures of memory array 155 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 310), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 300), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns, and sixty-four storage elements are shown connected in series in a column to form a NAND string.

During one configuration of read and program operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the Vth of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, Vread, (typically a voltage in the range of 5.5 to 8 V) to make the transistors operate as pass gates. The selected word line WL2 is connected to a voltage, a level of which is specified for each read and verify operation in order to determine whether a Vth of the concerned storage element is above or below such level. For example, in a read operation for a two-level storage element, the selected word line WL2 may be grounded, so that it is detected whether the Vth is higher than 0 V. In a verify operation for a two level storage element, the selected word line WL2 is connected to 0.8 V, for example, so that it is verified whether or not the Vth has reached at least 0.8 V. The source and p-well are at 0 V. The selected bit lines, assumed to be the even bit lines (BLe), are pre-charged to a level of, for example, 0.7 V. If the Vth is higher than the read or verify level on the word line, the potential level of the bit line (BLe) associated with the storage element of interest maintains the high level because of the non-conductive storage element. On the other hand, if the Vth is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line. Note that the above example describes voltage sensing in which the bit line voltage is discharged by a conductive storage element or stays at the pre-charged level for bit lines associated with non-conductive storage elements. However, current sensing can be used as well. During current sensing, the bit line voltage is held constant while the bit line current is being monitored to detect conducting and non-conducting storage elements.

Figure 4:
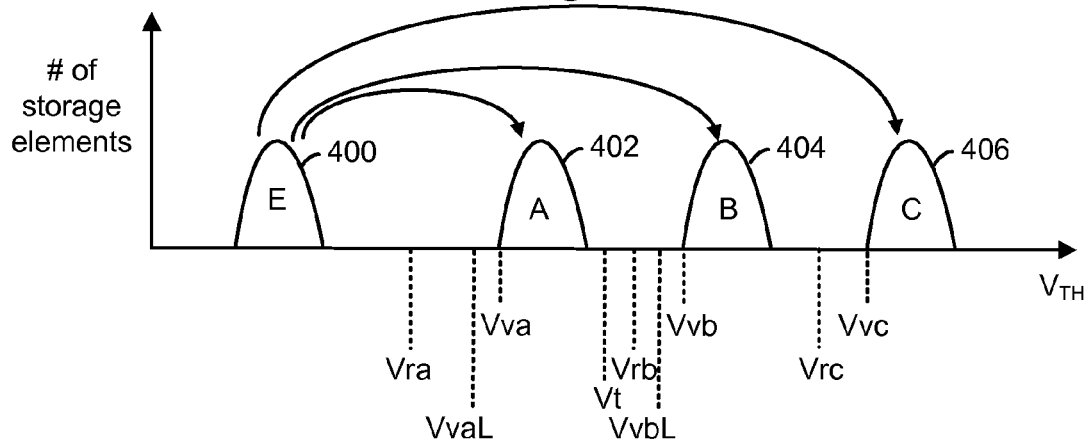
FIG. 4 depicts an example set of threshold voltage distributions and one-pass programming.

FIG. 4 depicts an example set of threshold voltage distributions and one-pass programming. Example threshold voltage distributions for the storage element array are provided for a case where each storage element stores two bits of data. A first threshold voltage distribution 400 is provided for erased (E state) storage elements. Three threshold voltage distributions 402, 404 and 406 represent programmed states A, B and C, respectively. In one embodiment, the threshold voltages in the E state distribution are negative and the threshold voltages in the A-, B- and C-state distributions are positive.

The number of storage elements which are in a particular state can be determined by maintaining a count of storage elements whose threshold voltage is determined to exceed the corresponding verify level.

Each distinct threshold voltage range corresponds to predetermined values for the set of data bits. The specific relationship between the data programmed into the storage element and the threshold voltage levels of the storage element depends upon the data encoding scheme adopted for the storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the other multi-state structures including those that include more or less than four states can also be used.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three target verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of program pulses such as depicted in FIG. 13a will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Another option is to use low and high verify levels for one or more data states. For example, VvaL and Vva are lower and higher verify levels, respectively, for the A-state, and VvbL and Vvb are lower and higher verify levels, respectively, for the B-state. A lower verify level is an offset verify level which is offset from a final or target verify level. An offset verify level could possibly be higher than the target verify level depending on the programming scheme. Moreover, the verify level can represent a voltage or a current.

During programming, when the threshold voltage of a storage element which is being programmed to the A-state as a target state exceeds VvaL, the programming speed of the storage element is slowed down, such as by raising the associated bit line voltage to a level which is between a program or non-inhibit level and a full inhibit level. This provides greater accuracy and thus a narrower Vt distribution by avoiding large step increases in threshold voltage. When the threshold voltage reaches Vva, the storage element is locked out from further programming. Similarly, when the threshold voltage of a storage element which is being programmed to the B-state as a target state exceeds VvbL, the programming speed of the storage element is slowed down, and when the threshold voltage reaches Vvb, the storage element is locked out from further programming. This programming technique has been referred to as a quick pass write or dual verify technique. Note that, in one approach, dual verify levels are not used for the highest state since a wider Vt distribution is typically acceptable. Instead, the dual verify levels can be used for the programmed states, above the erased state, and below the highest state.

In an example of eight-state programming, with an erased state and seven programmed states A-G, dual verify levels could be used for the intermediate states A-F, for instance.

It also possible to use three or more verify levels per state, so that a storage element is programmed at a full speed until it reaches the first verify level, then it is programmed at a medium speed until it reaches the second verify level, then it is programmed at a slow speed until it reaches the third and final verify level, after which it is locked out from programming.

Figure 5:
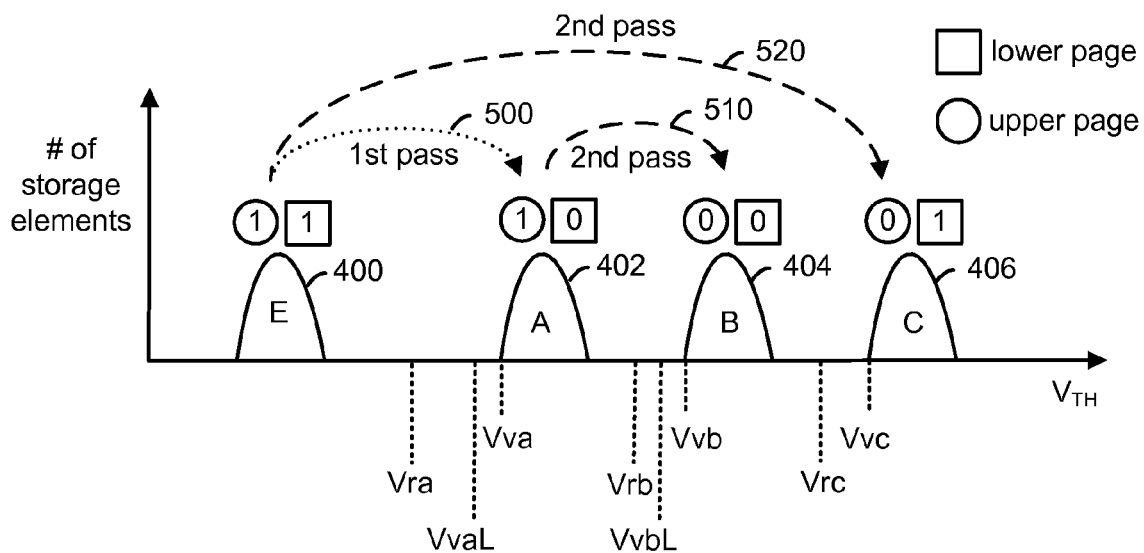
FIG. 5 depicts an example set of threshold voltage distributions and two-pass programming.

FIG. 5 illustrates an example of a two-pass technique of programming a multi-state storage element that stores data for two different pages: a lower page and an upper page. Four states are depicted by repeating the threshold voltage distributions 400, 402, 404 and 406 from FIG. 4. These states, and the bits they represent, are: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 500. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 520. If the storage element had been programmed into state A as a result of the first programming pass, then the storage element is further programmed in the second pass so that the threshold voltage is increased to be within state B, as depicted by arrow 510. Offset verify levels VvaL and VvbL can be used as well for the A and B data states, respectively, in this example. The result of the second pass is to program the storage element into the state designated to store a logic "0" for the upper page without changing the data for the lower page. In both FIG. 4 and FIG. 5, the amount of coupling to the floating gate on the adjacent word line depends on the final state.

In one embodiment, a system can be set up to perform full sequence writing if both lower and upper page data is available. If enough data is not available, then the programming process can program the lower page data with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements.

Figure 6A:
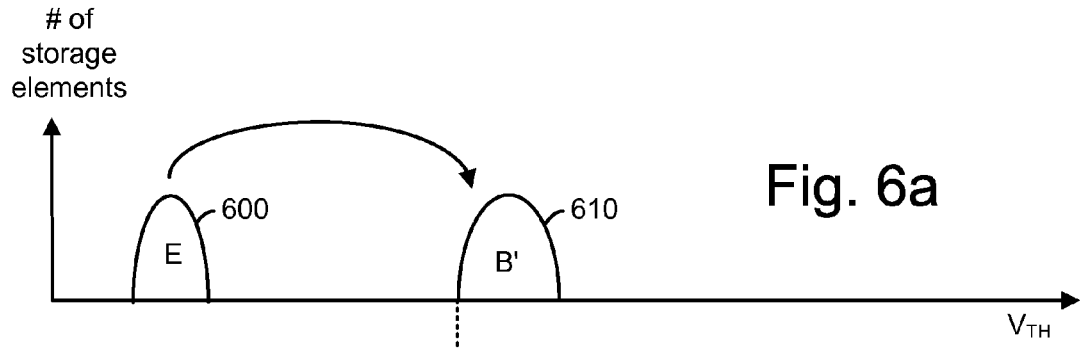
FIGS. 6a-c show various threshold voltage distributions and describe a process for programming non-volatile memory.
Figure 6B:
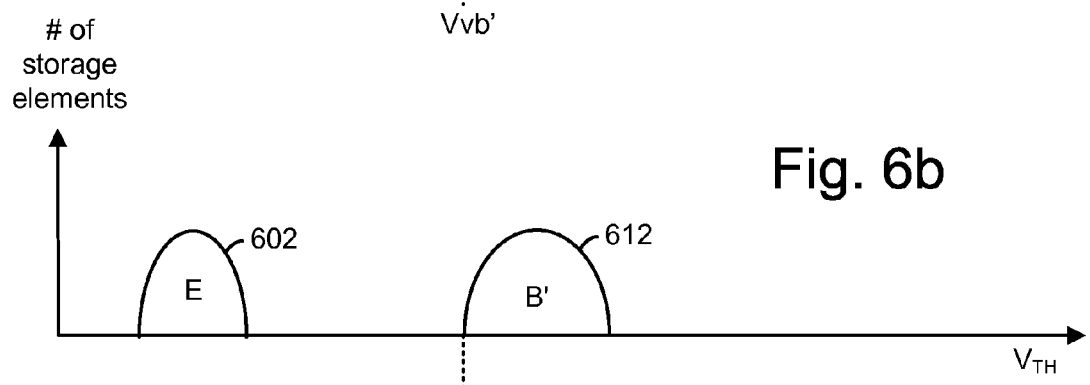
Figure 6C:
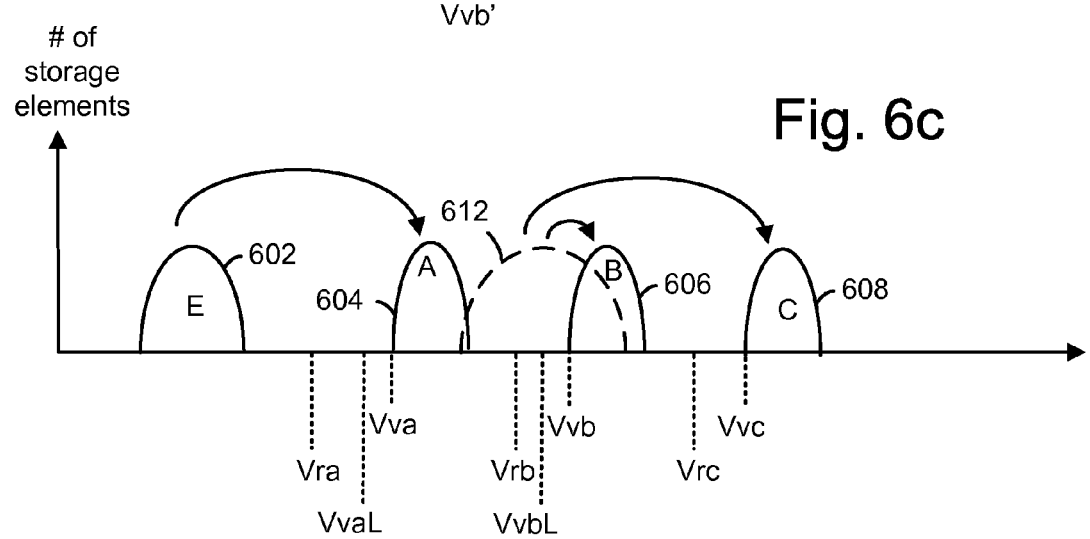

FIGS. 6a-c disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E (distribution 600). If the data is to be programmed to 0, then the threshold of voltage of the storage element is raised such that the storage element is programmed to state B' (distribution 610). FIG. 6a therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. This will have the effect of widening the threshold voltage distribution for state B' to that depicted as threshold voltage distribution 612 of FIG. 6b. This apparent widening of the threshold voltage distribution will be remedied when programming the upper page. The E state will also be widened as depicted by distribution 602.

FIG. 6c depicts the process of programming the upper page. If the storage element is in erased state E and the upper page is to remain at 1, then the storage element will remain in state E (distribution 602). If the storage element is in state E and its upper page data is to be programmed to 0, then the threshold voltage of the storage element will be raised so that the storage element is in state A (distribution 604). If the storage element was in intermediate threshold voltage distribution 612 and the upper page data is to remain at 1, then the storage element will be programmed to final state B (distribution 606). If the storage element is in intermediate threshold voltage distribution 612 and the upper page data is to become data 0, then the threshold voltage of the storage element will be raised so that the storage element is in state C (distribution 608). Offset verify levels can be used as well for the A and B data states, in this example. The process depicted by FIGS. 6a-c reduces the effect of floating gate to floating gate coupling because only the upper page programming of neighbor storage elements will have an effect on the apparent threshold voltage of a given storage element. An example of an alternate state coding is to move from distribution 612 to state C when the upper page data is a 1, and to move to state B when the upper page data is a 0.

Although FIGS. 6a-c provide an example with respect to four data states and two pages of data, the concepts taught can be applied to other implementations with more or fewer than four states and more or less than two pages. For example, memory devices with eight or sixteen states per storage element are currently planned or in production.

Figure 7:
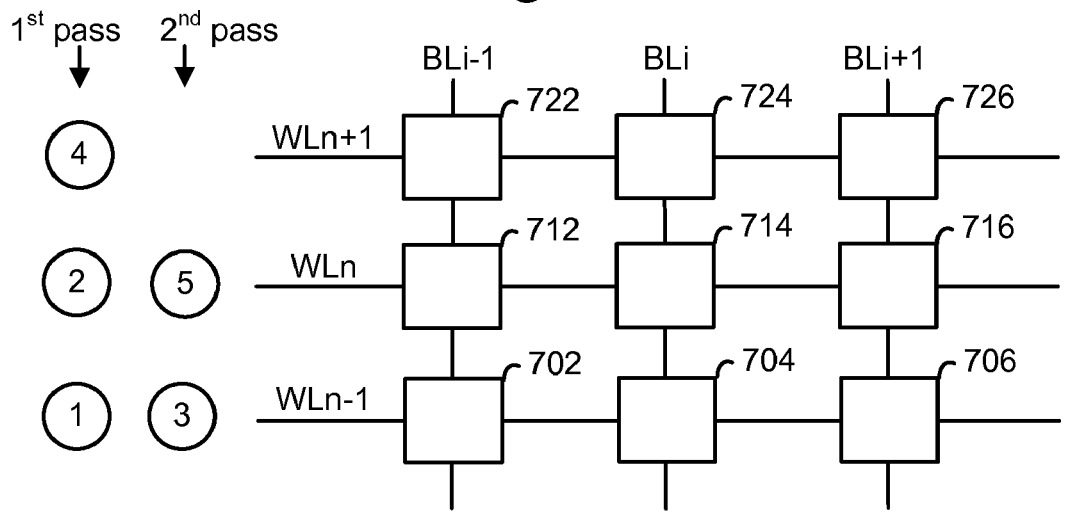
FIG. 7 depicts a multi-pass program operation for a set of storage elements.

FIG. 7 depicts a multi-pass program operation for a set of storage elements. The components depicted may be a subset of a much larger set of storage elements, word lines and bit lines. In one possible program operation, storage elements on WLn−1, e.g., storage elements 702, 704 and 706, are programmed in a first programming pass. This step is represented by the circled "1." Next ("2"), storage elements on WLn, e.g., storage elements 712, 714 and 716, are programmed in a first programming pass. In this example, when a word line is selected for programming, verify operations occur after each program pulse. During the verify operations on WLn, one or more verify voltages are applied to WLn and pass voltages are applied to the remaining word lines including WLn−1 and WLn+1. The pass voltages are used to turn on (make conductive) the unselected storage elements so that a sensing operation can occur for the selected word line. Next ("3"), storage elements on WLn−1 are programmed in a second programming pass. Next ("4"), storage elements on WLn+1 are programmed in a first programming pass. Next ("5"), the storage elements on WLn are programmed in a second programming pass to their final respective states.

Due to the programming on WLn+1, the storage elements on WLn are affected by coupling which tends to raise and widen their threshold voltage distribution for each state. This can occur during both single-pass and multi-pass programming. In single-pass pass programming, each word line is programmed completely before moving to the next word line, e.g., WLn−1, then WLn, then WLn+1.

Figure 8A:
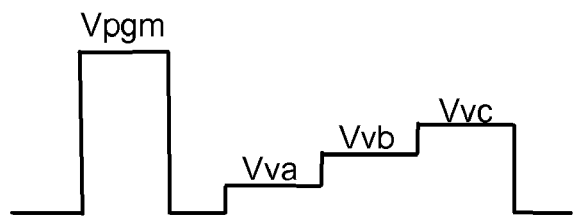
FIG. 8a depicts a programming iteration of a programming operation in which one verify level is used for each data state.

FIG. 8a depicts a programming iteration of a programming operation in which one verify level is used for each data state. A programming iteration generally refers to a cycle of a programming operation which is made up of multiple successive programming iterations in corresponding cycles. A programming iteration can be performed by applying one or more program pulses to a set of selected storage elements, such as via a selected word line, followed optionally by one or more verify operations. A verify operation generally refers to a procedure which tests one or more selected storage elements against a verify level, such as a voltage or current, using a sensing procedure. In this example, a program iteration includes a program pulse having an amplitude of Vpgm followed by verify operations involving target verify voltages Vva, Vvb and Vvc.

Figure 8B:
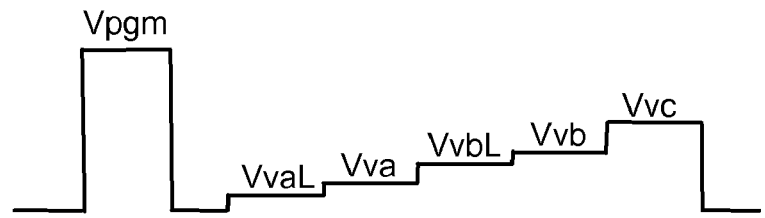
FIG. 8b depicts a programming iteration of a programming operation in which two verify levels are used for some data states.

FIG. 8b depicts a programming iteration of a programming operation in which two verify levels are used for some data states. In this approach, offset verify levels VvaL and VvbL are added, relative to FIG. 8a. When a storage element is verified to have reached an offset verify level for its target data, its programming speed is slowed, such as by raising an associated bit line voltage. As a result, tighter threshold voltage distributions can be achieved. However, this benefit is offset against the disadvantage of additional programming time due to the extra verify operations that are needed at the offset verify levels. Ideally, offset verify levels should be used sparingly, when they are most effective, to optimize the benefits relative to the costs.

Figure 9A:
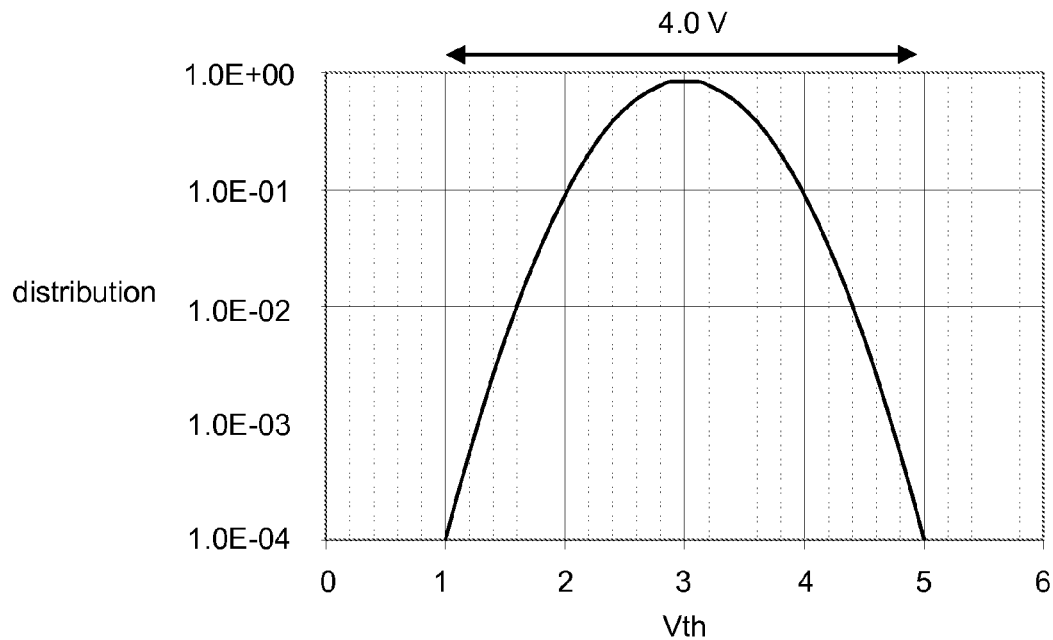
FIG. 9a depicts a natural programmed threshold voltage distribution of a set of storage elements.

FIG. 9a depicts a natural programmed threshold voltage distribution of a set of storage elements. Typically, when a dual verify scheme is used, the offset verify level and the target verify level are both used in a programming iteration. This maximize the number of storage elements which are tested against the dual verify levels. In some cases, a target verify level is not used until an offset verify level has been met by one or more storage elements. However, since the natural programmed threshold voltage distribution of a set of storage elements is quite wide, it is in fact possible to skip some of the verify operations which use the offset verify levels while still subjecting the majority of the storage elements to the dual verify operations. This approach minimizes the increase in programming time due to the use of dual verify levels while still maintaining most of the benefits of making the threshold voltage distributions tighter.

The natural programmed threshold voltage distribution for an example set of storage elements is depicted, where the x-axis indicates threshold voltage and the y-axis indicates a number of storage elements on a logarithmic scale. The distribution is generally symmetric about a mean or midpoint of 3.0 V in this example. Further, in this example, the distribution has a width of 4 V. The natural programmed threshold voltage distribution of a set of memory cells is the threshold voltage distribution obtained when the memory cells receive the same one or more pulses. It reflects the natural physical and electrical variations of a large number of storage elements. There are many factors that contribute to the variations, such as active layer (storage element width) size, channel length, tunnel oxide thickness, tunnel oxide local thinning, the shape of the floating gate, the inter-polysilicon ONO thickness as well as the source drain overlap area, etc.

Figure 9B:
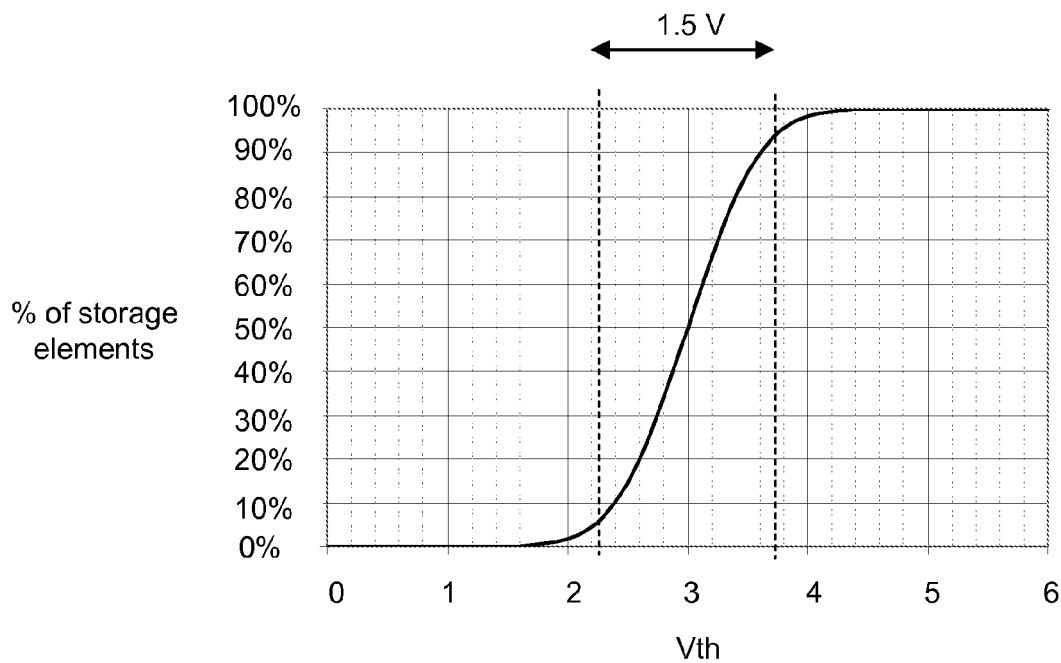

FIG. 9b depicts a cumulative percentage of storage elements relative for different scanned portions of the natural programmed threshold voltage distribution of FIG. 9a. The x-axis depicts a threshold voltage, and the y-axis depicts a portion of storage elements, as a percentage. Generally, a relatively large portion of the storage elements have threshold voltages which are relatively close to the mean, and a relatively small portion of the storage elements have threshold voltages which are relatively far from the mean.

To provide the dual verify scheme for all storage elements, the entire natural programmed threshold voltage distribution width would need to be scanned. For example, if Δ=4 V, and a program step size of 0.2 V is used, then about 4/0.2=20 verify operations at each of the offset and target verify levels would be needed to ensure that every storage element is subject to the dual verify scheme. In contrast, if a reduced portion of the storage elements are subject to the dual verify scheme, such as 90%, it would only be necessary to scan about 1.5 V of the natural programmed Vth distribution, as depicted. Thus, in order to verify 90% of the storage elements using an offset verify level, we would need only about 1.5/0.2≈8 verify operations. As a result, even with a significant reduction in the number of offset verify operations, e.g., from 20 to 8, the benefits of the dual verify scheme can be realized for a significant majority of the storage elements. An optimization of the number of offset verify operations and the final programmed Vth distribution can be performed to identify the best tradeoff between programming time and Vth distribution. Example programming schemes are detailed below.

Figure 10A:
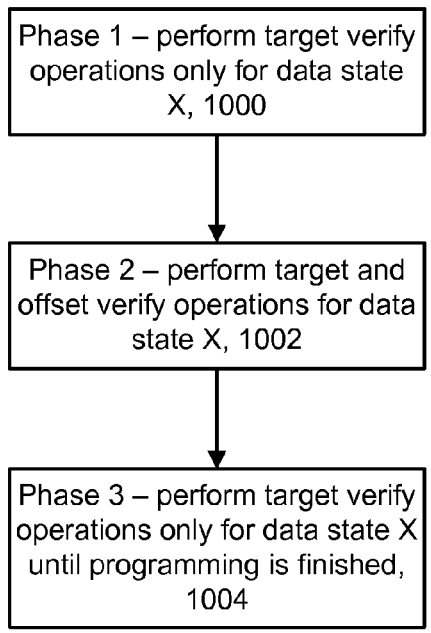
FIG. 10a depicts a first programming operation.

FIG. 10a depicts a first programming operation. In this example, a programming operation includes three phases. In the first phase (step 1000), only target verify operations, which are verify operations using a target verify level, are performed for a given data state, represented as data state X. Offset verify operations, which are verify operations using an offset verify level, e.g., offset from the target, are not performed. In a second phase (step 1002), both target and offset verify operations are performed for data state X. In a third phase (step 1004), only target verify operations are performed for data state X, until programming is finished.

Figure 10B:
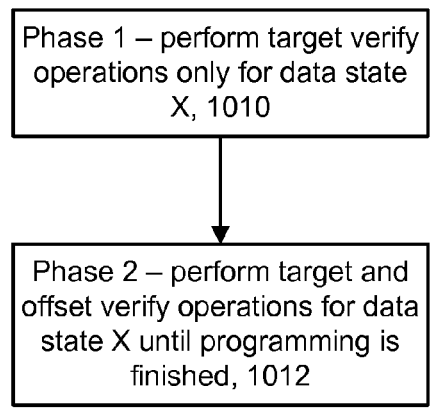
FIG. 10b depicts a second programming operation.
Figure 10C:
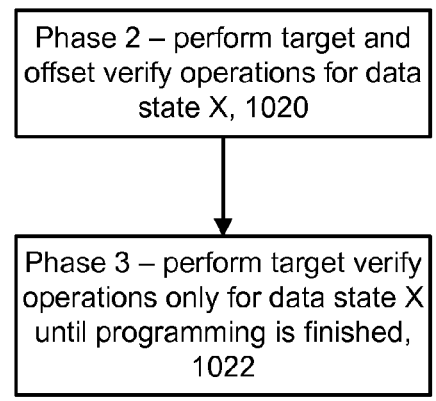
FIG. 10c depicts a third programming operation.

The programming operations of FIGS. 10a-10c can be performed generally in parallel for storage elements which are programmed to multiple data states.

FIG. 10b depicts a second programming operation. In this example, a programming operation includes two phases. In the first phase (step 1010), only target verify operations are performed for a given data state X. Offset verify operations are not performed. In a second phase (step 1012), both target and offset verify operations are performed for data state X, until programming is finished.

FIG. 10c depicts a third programming operation. In this example, a programming operation includes two phases. In the first phase (step 1020), both target and offset verify operations are performed for data state X. In a second phase (step 1022), only target verify operations are performed for data state X, until programming is finished. Offset verify operations are not performed.

Figure 11A:
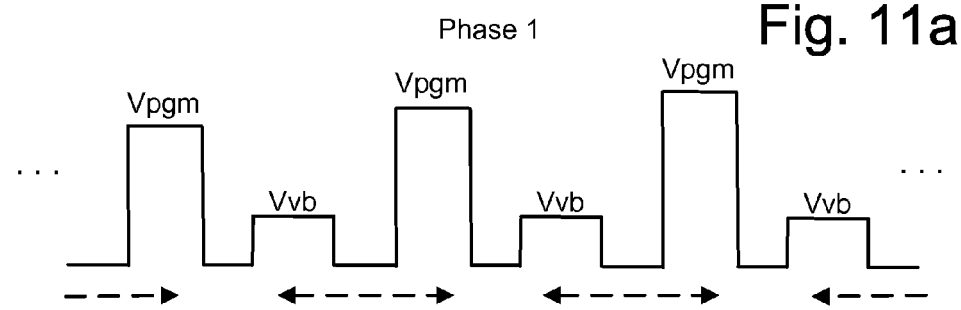
FIG. 11a depicts example programming iterations of phase 1 of the programming operation of FIG. 10a in which a target verify operation is performed for a target data state.

FIG. 11a depicts example programming iterations of phase 1 of the programming operation of FIG. 10a in which a target verify operation is performed for a target data state. In this example, only B-state storage elements, which are storage elements to be programmed to the B-state, are considered. Each iteration includes a program pulse, having an amplitude Vpgm, followed by a verify pulse, having an amplitude of Vvb. In one approach, Vpgm increases step-wise with each successive programming iteration. Phase 1 can occur when the number of program iterations, or loop count, N, is less than a specified loop count value, START_VL, such that N<START_VL.

Figure 11B:
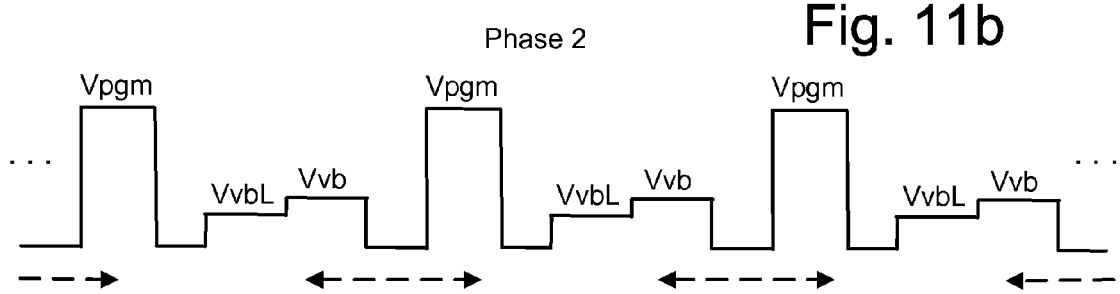
FIG. 11b depicts example programming iterations of phase 2 of the programming operation of FIG. 10a in which offset and target verify operations are performed for a target data state.
Figure 11C:
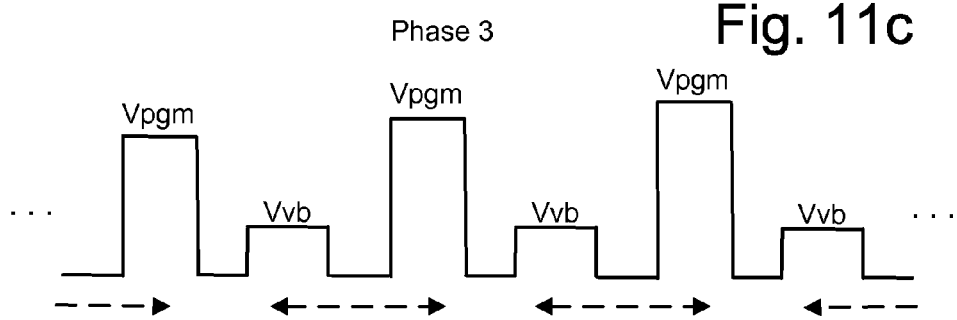
FIG. 11c depicts example programming iterations of phase 3 of the programming operation of FIG. 10a in which a target verify operation is performed for each target data state.

The dashed lines in FIGS. 11a-c represent time periods in which a bit scan is performed. As discussed further below in connection with FIG. 15, this can involve reading latches which are associated with bit lines of the storage elements to determine whether threshold voltages, or other measurable characteristic such as current, is above or below a comparison level such as a target or offset verify level. This information can be used to adaptively trigger transitions between programming phases, as discussed further below.

FIG. 11b depicts example programming iterations of phase 2 of the programming operation of FIG. 10a in which offset and target verify operations are performed for a target data state. Again, only B-state storage elements are considered. Each iteration includes a program pulse, having an amplitude Vpgm, followed by an offset verify pulse, having an amplitude of VvbL, followed by a target verify pulse, having an amplitude of Vvb. Phase 2 can occur when START_VL≦N<END_VL. END_VL can be a predetermined number of programming iterations, or determined adaptively, during programming.

FIG. 11c depicts example programming iterations of phase 3 of the programming operation of FIG. 10a in which a target verify operation is performed for each target data state. Again, only B-state storage elements are considered. Each iteration includes a program pulse, having an amplitude Vpgm, followed by a target verify pulse, having an amplitude of Vvb. Phase 3 can occur when N≧END_VL. By setting START_VL and END_VL appropriately, an optimum condition can be found which represents the best tradeoff between having a short programming time and having narrow Vth distributions for the different data states.

FIG. 12 depicts a programming operation involving data states A, B and C, where offset and target verify operations are performed for each of states A and B, and a target verify operation is performed for state C. In this programming operation 1200, four data states are used. The techniques herein can be extended to the use of other numbers of data states, such as eight or sixteen data states. The x-axis represents successive time points which are not necessarily equidistant, and the y-axis represents voltage amplitude. A sequence of seventeen program pulses 1210, 1215, 1220, 1225, 1230, 1235, 1240, 1245, 1250, 1255, 1260, 1265, 1270, 1275, 1280, 1285 and 1290 is depicted. Each pulse is applied, and a corresponding programming iteration begins, at a respective time point t1-t17. Except for the first program pulse 1210, each program pulse is followed by one or more verify pulses. For example, program pulse 1215 is followed by verify pulses 1205. Generally, it is possible to delay verify operations for a given state until a predetermined programming iteration. In this case, verify operations for state A are delayed until the second programming iteration. In some embodiments, the A state verify operations start immediately after the first programming pulse.

For a set of programming iterations 1201, verify operations using both VvaL and Vva are performed after each program pulse. For a set of programming iterations 1202, verify operations using VvaL, Vva, Vvbl and Vvb are performed after each program pulse. For a set of programming iterations 1203, verify operations using VvbL, Vvb and Vvc are performed after each program pulse. For a set of programming iterations 1204, verify operations using Vvc are performed after each program pulse. As mentions, this approach is not optimized since offset and target verify operations are performed in concert.

FIG. 13a depicts a programming operation involving data states A, B and C, where: (a) for each of states A and B, a target verify operation is initially performed followed by offset and target verify operations, followed by a target verify operation, and (b) for state C, a target verify operation is performed. In this programming operation 1300, four data states are used. A sequence of seventeen program pulses 1310, 1315, 1320, 1325, 1330, 1335, 1340, 1345, 1350, 1355, 1360, 1365, 1370, 1375, 1380, 1385 and 1390 is depicted. Each pulse is applied, and a corresponding programming iteration begins, at a respective time point t1-t17. Except for the first program pulse 1310, each program pulse is followed by one or more verify pulses.

Specifically, for a set of programming iterations 1301, verify operations using Vva are performed after each program pulse. For a set of programming iterations 1302, verify operations using VvaL and Vva are performed after each program pulse. For a set of programming iterations 1303, verify operations using VvaL, Vva and Vvb are performed after each program pulse. For a set of programming iterations 1304, verify operations using Vva, VvbL and Vvb are performed after each program pulse. For a set of programming iterations 1306, verify operations using VvbL, Vvb and Vvc are performed after each program pulse. For a set of programming iterations 1307, verify operations using Vvb and Vvc are performed after each program pulse. For a set of programming iterations 1308, verify operations using Vvc are performed after each program pulse.

FIG. 13b depicts the programming operation of FIG. 13a showing only A-state verify operations. By separately observing the programming of storage elements which have a common target data state, further insight can be gained. Here, programming of the A-state storage elements is depicted. The verify pulses for other states are omitted. The A-state verify levels Vva and VvaL are shown. NAVstart denotes a programming iteration at which verify operations begin for the A-state. In this example, NAVstart=2, so that verify operations begin for the A-state at the second programming iteration, at t2. NAVstart can be predetermined, for instance. During the set of programming iterations 1301, verify operations using Vva, but not VvaL, are performed. This corresponds to phase 1 of a three-phase programming operation for the A-state storage elements, such as described in connection with FIG. 10a. In this example, an integer number N1=2 iterations are performed in phase 1.

At t4, phase 2 of the three-phase programming operation for the A-state storage elements begins. In this phase, programming iterations 1302 and 1303 are performed in which verify operations using both VvaL and Vva are performed.

Phase 2 can be initiated in different ways. In one possible approach, phase 2 is initiated after a specified number of programming iterations (represented by a value Δ1) are completed in phase 1. Or, a time to begin phase 2 can be determined adaptively during programming. In one approach, phase 2 starts when at least a specified number of A-state storage elements have reached Vva (or no fewer than a specified number of A-state storage elements have reached Vva). Phase 2 can end when at least a specified number of A-state storage elements have reached VvL (or no fewer than a specified number of A-state storage elements have reached VvaL, that is, when the number of A-state storage elements that haven't reached VvaL is fewer than a specified number). In this example, an integer number N2=4 iterations are performed in phase 2.

Programming iterations 1304 perform verify operations using only Vva. This corresponds to phase 3 of the three-phase programming operation for the A-state storage elements. In this example, an integer number N3=2 iterations are performed in phase 3. Programming of state A can end when the Vth of at least a specified number of A-state storage elements exceeds Vva, or the Vth of fewer than a specified number of A-state storage elements does not exceed Vva.

FIG. 13c depicts the programming operation of FIG. 13a showing only B-state verify operations. Verification of the B-state storage elements can correspond generally to that of the A-state as depicted in FIG. 13c, but delayed in time. Generally, it is not necessary to begin verify operations for the B-state storage elements until a number of programming iterations have occurred in which the A-state storage elements have been verified.

Programming of the B-state storage elements is depicted. The verify pulses for other states are omitted. The B-state verify levels Vvb and VvbL are shown. NBVstart denotes a programming iteration at which verify operations begin for the B-state. In this example, NBVstart=6, so that verify operations begin for the B-state at the sixth programming iteration, at t6. NBVstart can be predetermined, or determined adaptively during programming. During the set of programming iterations 1303, verify operations using Vvb, but not VvbL, are performed. This corresponds to phase 1 of a three-phase programming operation for the state B storage elements, such as described in connection with FIG. 10a. In this example, N1=2 iterations are performed in phase 1.

At t8, phase 2 of the three-phase programming operation for the state B storage elements begins. In this phase, programming iterations 1302, 1304 and 1306 are performed in which verify operations using both VvbL and Vvb are performed. Phase 2 can be initiated in different ways. In one possible approach, phase 2 is initiated after a specified number of programming iterations (represented by a value Δ2) are completed in phase 1. Or, a time to start phase 2 is determined adaptively. Furthermore, the duration of phase 2 can be set in different ways. In one approach, the duration is set as a fixed number of programming iterations. In another approach, a time to start or end phase 2 is determined adaptively, as discussed in connection with the A-state. In this example, N2=4 iterations are performed in phase 1.

Programming iterations 1307 perform verify operations using only Vvb. This corresponds to phase 3 of the three-phase programming operation for the B-state storage elements.

Figure 13D:
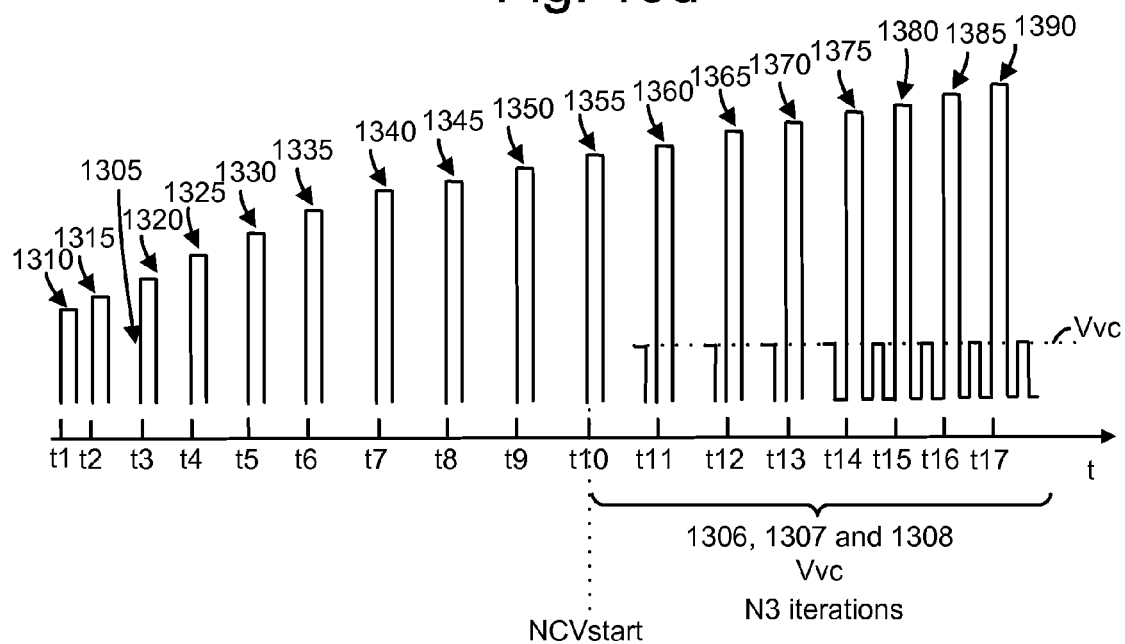
FIG. 13d depicts the programming operation of FIG. 13a showing only C-state verify operations.

FIG. 13d depicts the programming operation of FIG. 13a showing only C-state verify operations. In this example, the C-state is the highest state and is not subject to the dual verify scheme, although using a dual verify scheme is also possible. Verification of the C-state storage elements is delayed in time relative to the verification of the A- and B-state storage elements. Generally, it is not necessary to begin verify operations for the C-state storage elements until a number of programming iterations have occurred in which the B-state storage elements have been verified.

Programming of the C-state storage elements is depicted. The verify pulses for other states are omitted. The C-state verify level Vvc is shown. NCVstart denotes a programming iteration at which verify operations begin for the C-state. In this example, NCVstart=10, so that verify operations begin for the B-state at the tenth programming iteration, at t10. NCVstart can be predetermined, or determined adaptively during programming. During the set of programming iterations 1306, 1307 and 1308, verify operations using Vvc are performed. Only one verification phase is implemented for state C. In this example, N3=8 iterations are performed, after which programming is completed for all storage elements.

The values of N1, N2 and N3 can differ for the different states. Also, a first programming iteration of the second phase of N2 programming iterations can begin a predetermined number of programming iterations after a first programming iteration of the first phase of N1 programming iterations begins. Similarly, a first programming iteration of the third phase of N3 programming iterations can begin a predetermined number of programming iterations after a first programming iteration of the first phase, or a predetermined number of programming iterations after a first programming iteration of the first phase.

Figure 14A:
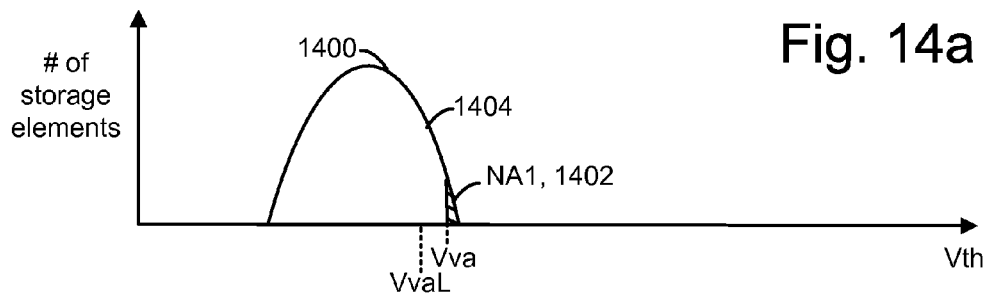
FIG. 14a depicts a threshold voltage distribution of a data state, where at least a specified number of storage elements has a threshold voltage less above a target verify level.

FIG. 14a depicts a threshold voltage distribution of a data state, where at least a specified number of storage elements has a threshold voltage less above a target verify level. A transient Vth distribution 1400 is provided for state A as a representative state. The discussed herein can apply to other states as well, mutatis mutandis. Offset verify level VvaL and target verify level Vva are also depicted. During programming, the threshold voltages of the A-state storage elements will gradually increase until a certain portion of the A-state storage elements have a Vth which is above Vva. For example, Vth distribution region 1402 represents the A-state storage elements for which Vth>Vva, and Vth distribution region 1404 represents the A-state storage elements for which Vth≦Vva.

In a set of storage elements, such as storage elements associated with a common word line, the distribution of storage elements in the different states is generally uniform, so that the number of storage elements which are to be programmed to the A-state, for instance, is about ¼ of all storage elements in the set, assuming there are four data states total. If there are, e.g., eight data states, the number of storage elements which are to be programmed to a given state, for instance, is about ⅛ of all storage elements in the set.

A criterion can be set such that phase 2 of a programming operation for A-state storage elements begins when Vth>Vva for a first number of A-state storage elements, or Vth≦Vva for a second number of storage elements. Generally, it is faster, and thus more efficient, to verify that Vth>Vva for a first number of A-state storage elements since the region 1402 represents fewer storage elements than the region 1404. A bit scan technique discussed further below can be used to determine if either of these conditions is met.

The number of storage elements (NA1) which are required to have a Vth of at least Vva can be relatively small, such as 1-5% of all A-state storage elements. Thus, phase 1 can be ended and phase 2 started when this condition is met. Another approach is to wait for a specified number of programming iterations, e.g., 1-2, after the condition is met.

Figure 14B:
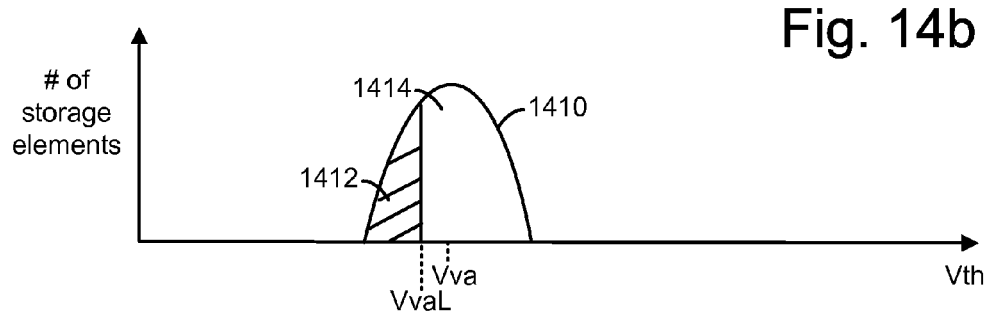
FIG. 14b depicts a threshold voltage distribution of a data state, where fewer than a specified number of storage elements has a threshold voltage less than an offset target verify level.

FIG. 14b depicts a threshold voltage distribution of a data state, where fewer than a specified number of storage elements has a threshold voltage less than an offset target verify level. After programming continues, the Vth distribution increases from the distribution 1400 of FIG. 14a to the distribution 1410 of FIG. 14b. This may occur during phase 2 of a programming operation. At this point, a certain portion of the A-state storage elements have a Vth which is above VvaL. For example, Vth distribution region 1412 represents the A-state storage elements for which Vth≦VvaL, and Vth distribution region 1414 represents the A-state storage elements for which Vth>VvaL. During phase 2 of a programming operation, both VvaL and Vva are used in verify operations. Accordingly, it is possible to determine when the Vth of most of the A-state storage elements has reached VvaL, and use this as a trigger to end phase 2 and begin phase 3 of the programming operation.

Generally, it is faster, and thus more efficient, to verify that Vth≦VvaL for a first number of A-state storage elements since the region 1412 represents fewer storage elements than the region 1414. A bit scan technique discussed further below can be used to determine if either of these conditions is met.

The number of storage elements (NA2) which have a Vth<VvaL can be relatively small, such as 1-10% of all A-state storage elements. Thus, phase 2 can be ended and phase 3 started when this condition is met. Another approach is to wait for a specified number of programming iterations, e.g., 1-2, after the condition is met. The condition of Vth<VvaL for a specified number of storage elements is referred to as bit ignore criteria, since it specifies a number of bits, e.g., storage elements, which can be ignored when the condition is met. That is, the A-state storage elements which have not reached yet VvaL are not tested against VvaL once the condition is met.

Figure 14C:
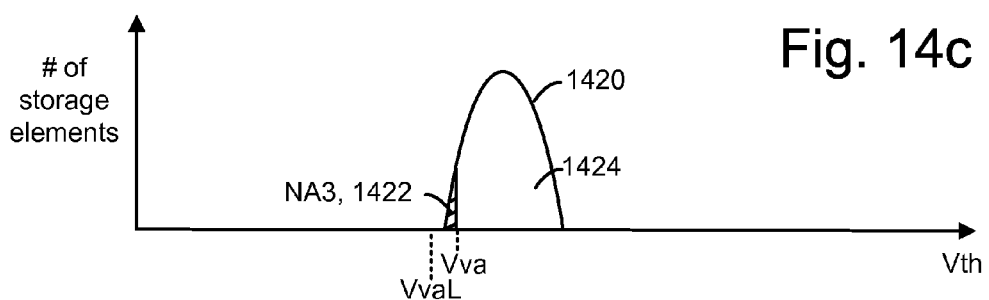
FIG. 14c depicts a threshold voltage distribution of a data state, where fewer than a specified number of storage elements has a threshold voltage less than a target verify level.

FIG. 14c depicts a threshold voltage distribution of a data state, where fewer than a specified number of storage elements has a threshold voltage less than a target verify level. After programming continues, the Vth distribution increases from the distribution 1410 of FIG. 14b to the distribution 1420 of FIG. 14c. This may occur during phase 3 of a programming operation. At this point, a certain portion of the A-state storage elements have a Vth which is above Vva. For example, Vth distribution region 1422 represents the A-state storage elements for which Vth≦Vva, and Vth distribution region 1424 represents the A-state storage elements for which Vth>Vva. During phase 3 of a programming operation, Vva is used in verify operations. When the Vth of nearly all of the A-state storage elements has reached Vva, this can be used as a trigger to end phase 3 and to thereby end the programming operation. Vt distribution region 1422 can be wider (weaker slope) than region 1402, as that part of the distribution (region 1422) has not yet been verified and thus not yet been narrowed.

Generally, it is faster, and thus more efficient, to verify that Vth≦Vva for a first number of A-state storage elements since the region 1422 represents fewer storage elements than the region 1424. A bit scan technique discussed further below can be used to determine if either of these conditions is met. The condition of Vth<Vva for a specified number of storage elements is referred to as bit ignore criteria, since it specifies a number of bits, e.g., storage elements, which can be ignored when the condition is met. That is, the A-state storage elements which have not reached yet Vva are not tested against Vva once the condition is met.

The number of storage elements (NA3) which are allowed to have a Vth<Vva is typically small, e.g., under 1% of all A-state storage elements. Thus, NA1, NA2 and NA3 are bit ignore values for the A-state, where, generally, NA2>NA1>NA3. For example, NA2=10% of all bits in a word line, NA1=5% of all bits in a word line and NA3=1% of all bits in a word line. We can also define NB1, NB2 and NB3 as bit ignore values for the B-state, where, generally, NB2>NB1>NB3. It is possible but not necessary for NB1=NA1, NB2=NA2 and NB3=NA3. We can also define NC1, NC2 and NCB3 as bit ignore values for the C-state, where, generally, NC2>NC1>NC3. Or, we can only define NC3 as a bit ignore value for the C-state, where it is possible but not necessary for NC3=NB3=NA3.

When the condition of FIG. 14c is met, the A-state storage elements are considered to have a status of "pass," indicating that programming of these storage elements has been successfully completed.

Figure 15:
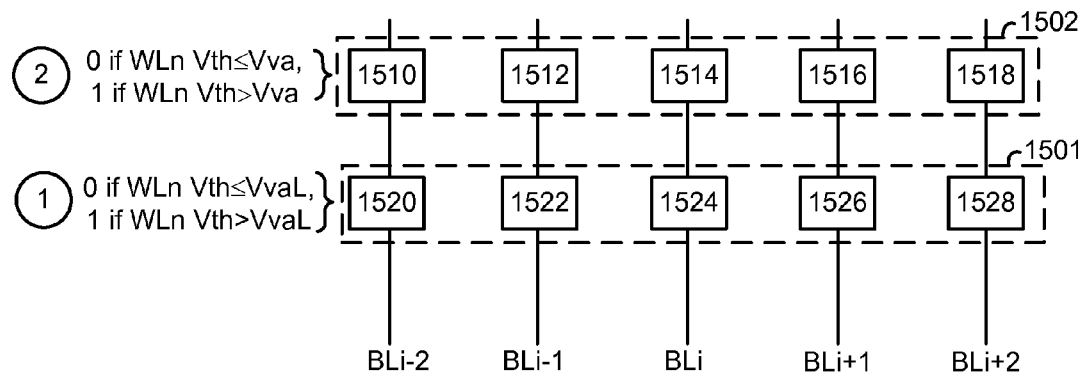
FIG. 15 depicts the use of data latches during a programming operation.

FIG. 15 depicts the use of data latches during a programming operation. In a memory device, a number of data latches, each storing one bit, may be provided for each bit line. In one possible approach, each bit line has two latches, each storing one bit. A first set of latches 1501 includes latches 1520, 1522, 1524, 1526 and 1528 which are connected to bit lines BLi−2, BLi−1, BL, BLi+1 and BLi+2, respectively. A second set of latches 1502 includes latches 1510, 1512, 1514, 1516 and 1518 which are connected to bit lines BLi−2, BLi−1, BL, BLi+1 and BLi+2, respectively. Initially, all 0 bits are stored in the latches. During programming, as represented by the circled "1," when the threshold voltage Vth of a storage element which is intended to be programmed to a target state of A, for instance, exceeds the offset verify level, VvaL (e.g., Vth>VvaL), the corresponding latch in set 1501 is set to bit=1. Bit=0 remains in the latches of set 1501 as long as Vth≦VvaL.

Subsequently, as represented by the circled "2," when the threshold voltage Vth of a storage element which is intended to be programmed to the target state of A exceeds the higher verify level, Vva (e.g., Vth>Vva), the corresponding latch in set 1502 is set to bit=1. Bit=0 remains in the latches of set 1502 as long as Vth≦Vva.

The latches 1501 or 1502 can be read, e.g., scanned, by control circuitry, concurrent with the programming iteration to avoid or minimize an increase in programming time. For example, the dashed lines in FIGS. 11a-c depict when such scanning can occur. During phase 1 of a programming operation, for example, the latches 1502 can be scanned to determine if the condition depicted in FIG. 14a has occurred, thereby triggering phase 2 of the programming operation. During phase 2 of the programming operation, for example, the latches 1501 can be scanned to determine if the condition depicted in FIG. 14b has occurred, thereby triggering phase 3 of the programming operation. During phase 3 of the programming operation, for example, the latches 1502 can again be scanned to determine if the condition depicted in FIG. 14c has occurred, thereby concluding the programming operation.

FIG. 16 depicts the programming process of FIG. 10a in which the timing of phase 2 is based on predetermined criteria. In this example, phase 2 begins and ends based on a count of programming iterations.

A programming operation begins at step 1600. At step 1602, a number of parameters are initialized. For example, a pulse number N is set to 1, and a programming status for states A, B and C is set to fail, indicating that programming had not yet been completed. Additionally, NAVstart, and NBVstart and NCVstart are set to identify the programming iteration at which verify operations begin for the A-, B- and C-state storage elements, respectively. As mentioned, typically it is efficient to stagger the start of verify operations for the different data states, with verifying operations starting soonest for the lowest states and latest for the highest states.

Δ1 identifies a number of programming iterations in phase 1, and Δ2 identifies a number of programming iterations in phase 2. These values can be set individually for each programmed data state. However, using the same values for all data states is more efficient as it does not require additional information to be stored. Moreover, using common values is appropriate since the threshold voltage distributions for the different data states are usually similar.

At step 1606, a program pulse is applied to a set of selected storage elements, such as via a selected word line. At decision step 1608, if N has not yet reached NAVstart, no verify operation is performed (step 1610) for the current programming iteration. Decision step 1660 follows step 1610. However, if decision step 1608 is true (T), then a determination is made at decision step 1612 as to whether a "pass" status has been set for the A-state storage elements. If the "pass" status has not yet been set, then a determination is made at a decision step 1618 as to whether the pulse number is in a range in which phase 2 of the programming operation is performed. Specifically, a determination is made as to whether N≧NAVstart+Δ1 (the starting iteration of phase 2) and N<NAVstart+Δ1+Δ2 (the ending iteration of phase 2).

If decision step 1618 is true, then phase 2 is active, and verify operations are performed at the offset and target verify levels for state A, that is, at VvaL and VvA, respectively. If decision step 1618 is false (F), then phase 1 or 3 is active, and a verify operation is performed at Vva, but not at VvaL, at step 1622.

At step 1624, NA, a number of storage elements whose threshold voltage is below Vva, is determined. This corresponds, e.g., to the number of storage elements in the region 1422 of FIG. 14c. At decision step 1626, a determination is made as to whether NA<NA3, where NA3 is a bit ignore value. If decision step 1626 is true, then the status is set to "pass" for the A-state storage elements, at step 1628. If decision step 1626 is false, then a determination is made at decision step 1630 as to whether N≧NBVstart. This is a determination as to whether the predetermined programming iteration has been reached at which verify operations begin for B-state storage elements. If decision step 1630 is false, then decision step 1660, discussed further below, is reached. If decision step 1630 is true, then a determination is made at decision step 1632 as to whether a "pass" status has been set for the B-state storage elements. If decision step 1632 is false, programming continues for the B-state storage elements. If decision step 1632 is true, then decision step 1646, discussed further below, is reached.

At decision step 1634, a determination is made as to whether the program pulse number is within the range in which phase 2 is active, e.g., where both offset and target verify operations are performed. If decision step 1634 is true, then verify operations at VvbL and Vvb are performed, at step 1636. If decision step 1634 is false, then phase 1 or 3 is active, and verify operations are performed at Vvb but not at VvbL, at step 1638. Step 1640 determines a number, NB, of storage elements whose threshold voltage is below Vvb. This is similar to the number of storage elements in the region 1422 of FIG. 14c.

At decision step 1642, if NB<NB3, where NB3=NA3 in one approach, then a "pass" status is set for state B at 1644. If decision step 1642 is false, then a determination is made at decision step 1646 as to whether N≧NCstart, an initial programming iteration at which C-state verify operations begin. If this is true, a verify operation is performed at Vvc, at step 1650. Recall that state C is the highest state in this example and no offset verify voltage is used. However, alternatively it is possible to use an offset verify voltage in addition to the target verify voltage for the highest data state. At step 1652, a value NC is determined which is the number of storage elements whose threshold voltage is below Vvc. For example, this corresponds to the number of storage elements in the region 1422 in FIG. 14c.

At decision step 1654, if NC<NC3, where NC3=NA3 in one approach, then a "pass" status is set for the state C at step 1656. If decision step 1654 is false, then a determination is made at decision step 1660 as to whether N≧Nmax. Typically, a maximum number of program iterations, also referred to as loops in a loop count, are allowed, such as 20 to 25. If decision step 1660 is true, the limit has been reached without a "pass" status being provided for all data states. As a result, an indication is set at step 1662 that programming has failed.

However, at decision step 1660, if Nmax has not yet been reached, then the pulse number N is incremented at step 1604 and the processing proceeds in a next programming iteration, as discussed.

Note that the values NA3, NB3 and NC3 can be the same, in one possible approach.

Alternatively, steps 1640, 1642 and 1644 can be skipped if step 1626 is false, and steps 1652, 1654 and 1656 can be skipped if step 1642 is false. That is, if we know that the NA criterion has not passed, we can assume that NB and NC criteria will not pass either. Because if enough cells have not passed through A, then they have certainly not passed through B and C. Similarly, if we know that the NB criterion has not passed, then we can assume that NC criteria will not pass either. Because if enough cells have not passed through B, then they have certainly not passed through C. This approach saves time which we would have spent in scanning and determining NB and NC. So, NB scanning can only occur after NA has passed (which means A-status is pass) and NC scanning can only occur when NB has passed (which means B-status is pass).

Figure 17A:
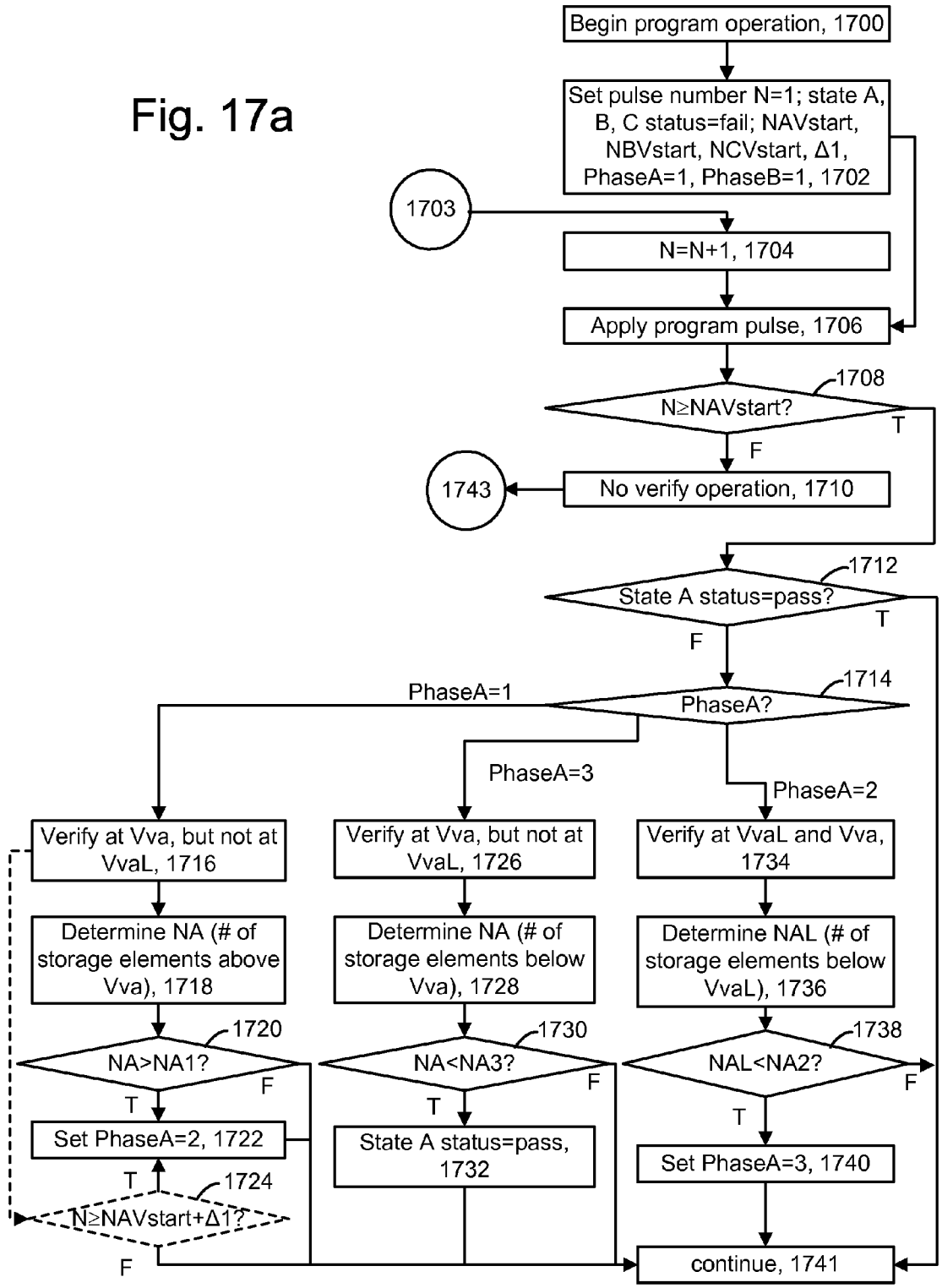
FIG. 17a-c depict the programming process of FIG. 10a in which the timing of the start and/or end of phase 2 is based on adaptive criteria.
Figure 17B:
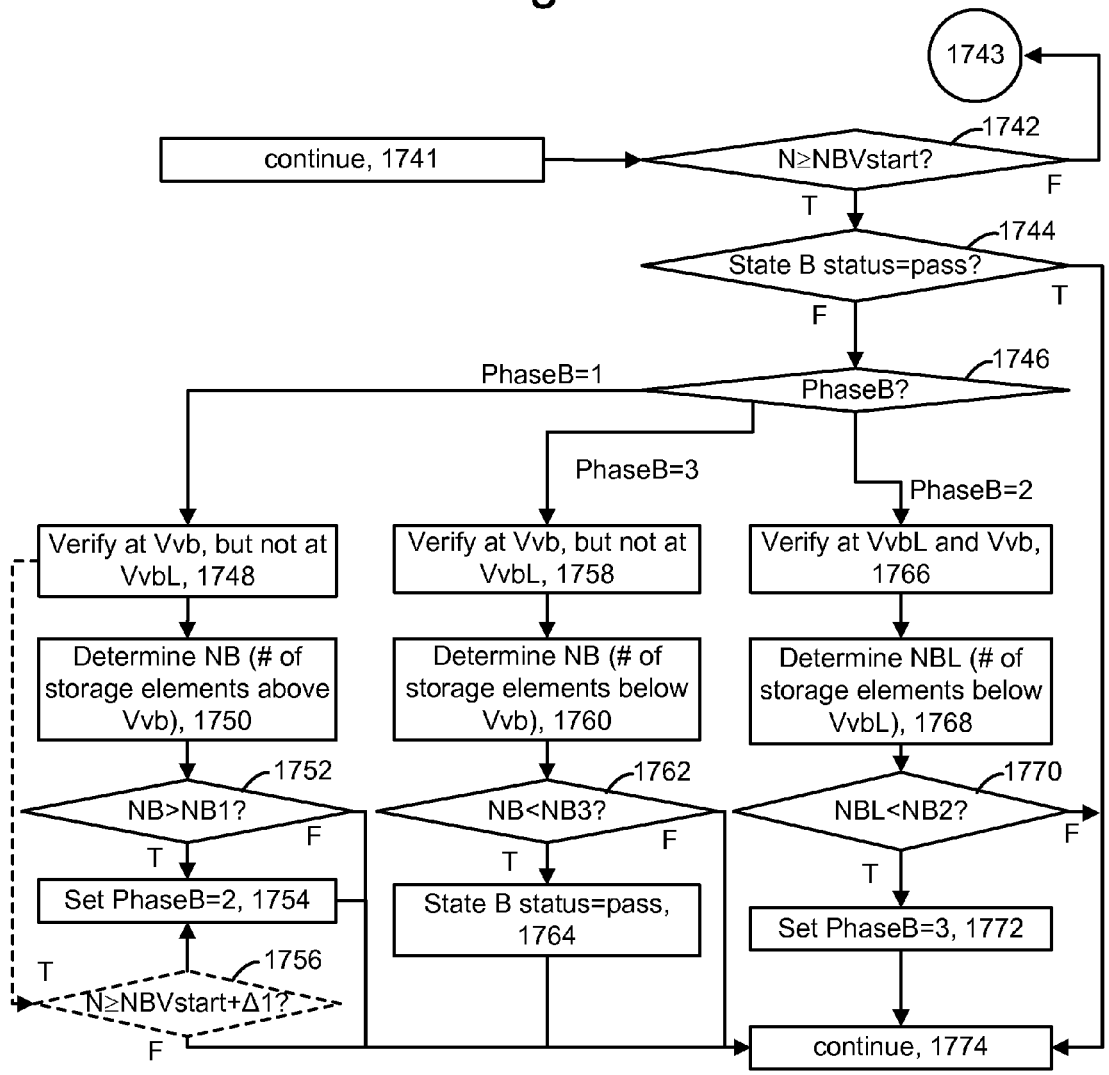
Figure 17C:
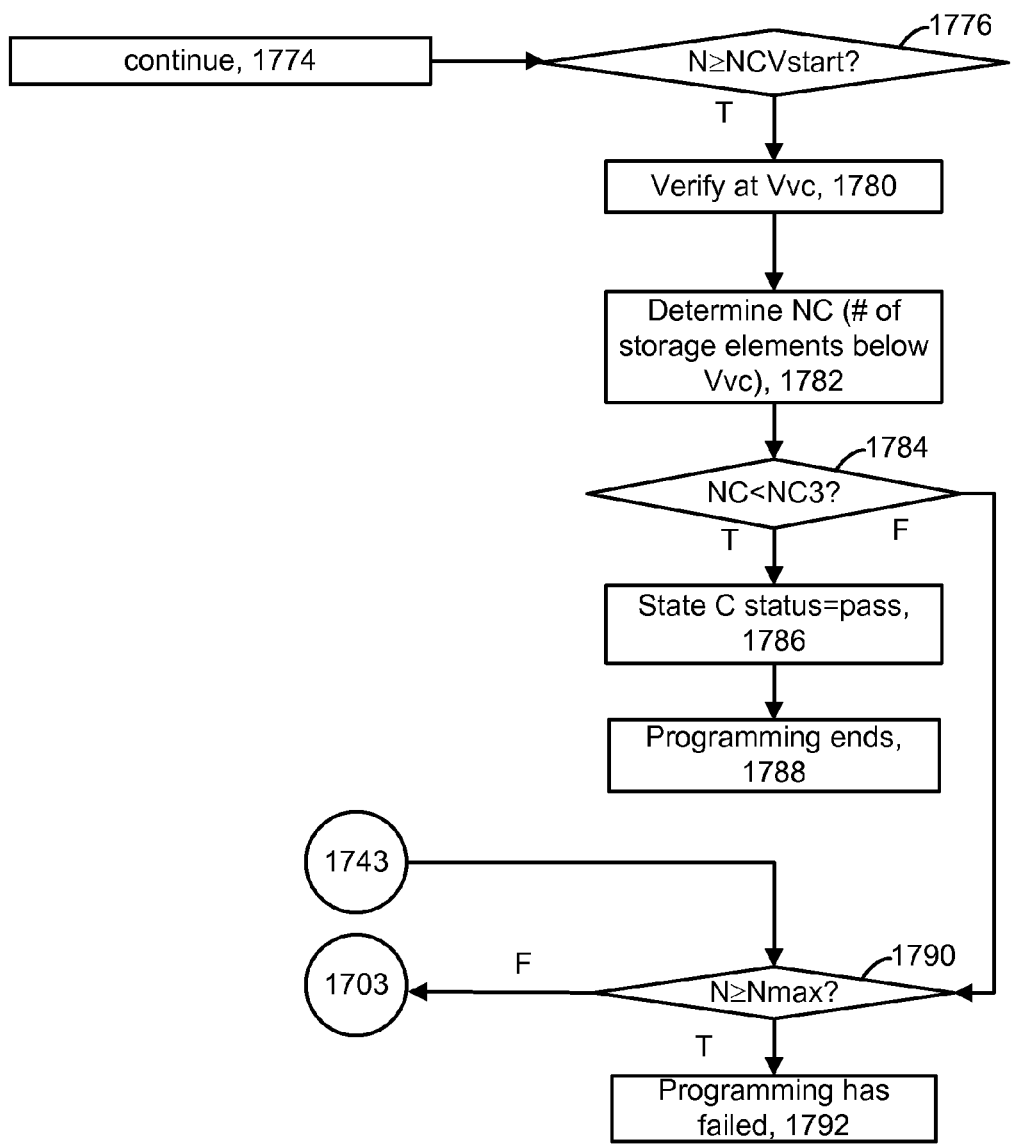

FIG. 17a-c depict the programming process of FIG. 10a in which the timing of the start and/or end of phase 2 is based on adaptive criteria.

In FIG. 17a, a program operation begins at step 1700. At step 1702, various parameters are initialized, similar to step 1602 in FIG. 16. However, the value Δ2 is not used since the end of phase two of the programming operation is determined adaptively rather than as a fixed number of programming iterations, in this implementation. The start of phase 2 can be determined based on a predetermined number of programming iterations, e.g., Δ1. Or, the start of phase 2 can be determined adaptively, such as when the condition of FIG. 14a is met. Additionally, two parameters referred to as PhaseA and PhaseB are initialized to indicate that phase 1 of the programming operation is set. PhaseA and PhaseB can be set to 2 when the condition of FIG. 14b is met for state A or B, respectively, and to 3 when the condition of FIG. 14c is met for states A and B, respectively. In an implementation with additional states, additional parameters can be set accordingly. A phase parameter is not provided for state C in this example since only one phase is used. At step 1706, a program pulse is applied. At decision step 1708, a determination is made as to whether N≧NAVstart. If the pulse number has not yet reached NAVstart, then no verify operations are performed (step 1710) for the current programming iteration. However, if decision step 1708 is true, then a determination is made at decision step 1712 as to whether a "pass" status has been set for state A. If decision step 1712 is true, then a continue step 1741 is reached (see FIG. 17b). If decision step 1712 is false, then PhaseA is evaluated at decision step 1714. After step 1710, step 1743 leads to step 1790 in FIG. 17c.

If PhaseA=1, a verify operation is performed at Vva but not at VvaL, at step 1716. Subsequently at step 1718, a number NA of storage elements whose threshold voltage is above Vva is determined. This corresponds to the number of storage elements in region 1402 in FIG. 14a. In decision step 1720, a determination is made as to whether NA>NA1. If this is true, phase 2 is initiated by setting PhaseA=2 at step 1722. Thus, phase 2 is initiated adaptively during programming. Alternatively, after step 1716, decision step 1724 can be used to determine whether N≧NAVstart+Δ1. If this is true, PhaseA=2 at step 1724. If decision step 1724 is false, the continue step 1741 is reached. Similarly, if decision step 1720 is false, the continue step 1741 is reached.

At decision step 1714, if PhaseA=2, verify operations at VvaL and Vva are performed (step 1734). At step 1736, a number NAL, which is the number of storage elements whose threshold voltage is below VvaL, is determined. This corresponds to the number of storage elements in the region 1412 in FIG. 14b. At decision step 1738, a determination is made as to whether NAL<NA2. If decision step 1738 is true, then phase 3 is started by setting PhaseA=3 at step 1740. Thus, phase 3 is started adaptively, during the programming operation. If decision step 1738 is false, then continue step 1741 is reached.

At decision step 1714, if PhaseA=3, a verify operation is performed at Vva but not at VvaL, at step 1726. At step 1728, a number NA of storage elements whose threshold voltage is below Vva is determined. This corresponds to the number of storage elements in region 1422 in FIG. 14c. In decision step 1730, a determination is made as to whether NA<NA3. Note also that the value NA is a different measured value in steps 1720 and 1730. If decision step 1730 is true, a "pass" status is set for the A-state storage elements. If decision step 1730 is false, continue step 1741 is reached.

In FIG. 17b, after the continue step 1741, a determination is made at decision step 1742 as to whether N≧NBVstart, which is the condition for determining whether verify operations should begin for the B-state. If decision step 1742 is true, then a determination is made at decision step 1744 as to whether a "pass" status has been set for the B-state storage elements. If decision step 1744 is false, then PhaseB is evaluated at decision step 1746.

If PhaseB=1, a verify operation is performed at Vvb but not at VvbL, at step 1748. Subsequently at step 1750, a number NB of storage elements whose threshold voltage is above Vvb is determined. This corresponds to the number of storage elements in region 1402 in FIG. 14a. In decision step 1752, a determination is made as to whether NB>NB1. If this is true, phase 2 is initiated by setting PhaseB=2 at step 1754. Thus, phase 2 is initiated adaptively during programming. Alternatively, after step 1748, decision step 1756 can be used to determine whether N≧NBVstart+Δ1. If this is true, PhaseB=2 at step 1754. If decision step 1756 is false, the continue step 1774 is reached. Similarly, if decision step 1752 is false, the continue step 1774 is reached.

At decision step 1746, if PhaseB=2, verify operations at VvbL and Vvb are performed (step 1766). At step 1768, a number NBL, which is the number of storage elements whose threshold voltage is below VvbL, is determined. This corresponds to the number of storage elements in the region 1412 in FIG. 14b. At decision step 1770, a determination is made as to whether NBL<NB2. If decision step 1770 is true, then phase 3 is started by setting PhaseB=3 at step 1772. Thus, phase 3 is started adaptively, during the programming operation. If decision step 1770 is false, then continue step 1774 is reached.

At decision step 1746, if PhaseA=3, a verify operation is performed at Vvb but not at VvbL, at step 1758. At step 1760, a number NB of storage elements whose threshold voltage is below Vvb is determined. This corresponds to the number of storage elements in region 1422 in FIG. 14c. In decision step 1762, a determination is made as to whether NB<NB3. Note that the value NB is a different measured value in steps 1752 and 1762. If decision step 1762 is true, a "pass" status is set for the B-state storage elements. If decision step 1762 is false, continue step 1774 is reached.

In FIG. 17c, after the continue step 1774, a determination is made at decision step 1776 as to whether N≧NCVstart, which is the condition for determining whether verify operations should begin for the C-state. If decision step 1776 is true, a verify operation is performed at Vvc, at step 1780. In this implementation, no offset verify level is used for the C-state. Subsequently at step 1782, a number NC of storage elements whose threshold voltage is below Vvc is determined. This corresponds to the number of storage elements in region 1422 in FIG. 14c. In decision step 1784, a determination is made as to whether NC<NC3. If decision step 1784 is true, a "pass" status is set for the C-state storage elements at step 1786, and programming ends at step 1788.

If decision step 1784 is false, a determination is made at decision step 1790 as to whether N≧Nmax. If this is true, then programming has failed (step 1792) because all states have not yet reached the "pass" status. If decision step 1790 is false, then programming proceeds at step 1703. Referring to FIG. 17a, after step 1703, the pulse number N is incremented at step 1704 in a next programming iteration, and programming proceeds as previously discussed.

The decision step 1790 is also reached from step 1743, which follows decision step 1742 in FIG. 17b.

In determining the number of storage elements which have a threshold voltage above or below a threshold level, whether it is an offset level such as VvaL or VvbL, or a target level, such as Vva, Vvb or Vvc, it may be necessary to perform a significant number of bit scans, resulting in a performance impact. To address this, a sampling technique may be used in which a bit scan is performed only on a limited number of storage elements (NAND strings), such as on ¼th or ⅛th or ¹⁄₁₆th (or any other portion) of the NAND strings. The number of storage elements detected can be used as an indication of the total number of storage elements on the entire selected word line (or page) that is above or below the verify level. This can minimize the bit-scan time and hence reduce the performance impact. For example, if we want bit-ignore (A) in step 1720 of FIG. 17a to be 256 storage elements, then, in step 1718, it may be concluded that detecting 256 storage elements on the whole page consumes too much time and causes a performance loss. In contrast, with sampling, a bit-scan is performed only on, e.g., ⅛th of all the NAND strings, and instead of using a 256 bit-ignore criteria, the bit-ignore criteria can be reduced to 32 (256*⅛). Such a small number of storage elements can be detected within the program pulse, so that the impact on total programming performance is negligible.

As mentioned in connection with FIG. 15, the bit scan can involve reading latches which indicate whether a storage element has a Vth above or below an offset verify level, and a target verify level. The controller performs a scan on a sample of the data latches and counts the number of bits. Moreover, it can be assumed that the distribution of states is uniform across a set of storage elements such as on a word line. For example, regarding steps 1718 and 1720 of FIG. 17*a*, and the example of ⅛ sampling, we can assume that A-state storage elements are uniformly distributed across the bit lines. The controller can identify any uniformly spread out ⅛$^{th}$ of the bit lines, so that we expect the number of A-state storage elements in that portion to be ⅛$^{th}$ of the total number of A-state storage elements. We can therefore scan only ⅛$^{th}$ of the bit lines and still estimate the total number of storage elements on the page whose Vth is above Vva, for instance.

The sample of bit lines which is identified can be based on any technique. For example, the controller can identify the first ⅛$^{th}$ of bit lines, or the second ⅛$^{th}$ of bit lines, or so forth. In another option, assume there are 8 kilobytes on the page, and we divide the page into 64 sectors of ⅛ kilobyte each. So, to scan ⅛$^{th}$ of the bits, we can scan sectors #1, #9, #17, . . . or sectors #2, #10, #18, . . . and so forth. This approach spreads the scanning across the bit lines. Another approach is to scan adjacent sectors 1-8, or 9-16, and so forth. Many combinations are possible.

The sampling can apply, e.g., to steps 1624 and 1626, 1640 and 1642, 1652 and 1654, 1718 and 1720, 1728 and 1730, 1736 and 1738, 1750 and 1752, 1760 and 1762, 1768 and 1770, and 1782 and 1784, for instance. Furthermore, it is possible to use different sampling ratios in the different steps. For example, different sampling ratios may be used for different data states, or for offset versus target verify levels.

Alternatively, steps 1750, 1752, 1760, 1762, 1768 and 1770 can be skipped if step 1720 is false, and steps 1782 and 1784 can be skipped if step 1752 is false. Generally, to avoid unnecessary scanning and determining of NB and NC, PhaseB=1 need not start until PhaseA=1 finishes (and PhaseA=2 is set), and PhaseB=2 need not start until PhaseA=2 finishes (and PhaseA=3 is set).

In one embodiment of the technology described herein, a method for performing a plurality of programming iterations of a programming operation for a set of storage elements in a non-volatile storage system is presented. The method includes, for each of N2 programming iterations for the set, applying a program pulse, performing a verify operation using an offset verify level for a data state, the offset verify level is offset from a final verify level for the data state, and performing a verify operation using the final verify level. The method further includes, for each of N3 programming iterations for the set, following the N2 programming iterations, applying a program pulse, and performing a verify operation using the final verify level, without performing a verify operation using the offset verify level.

In another embodiment, a method for performing a plurality of programming iterations of a programming operation for a set of storage elements in a non-volatile storage system is provided. The method includes, for each of N1 programming iterations for the set, applying a program pulse, and performing a verify operation using a final verify level for a data state, without performing a verify operation using an offset verify level for the data state, the offset level is offset from the final verify level. The method further includes, for each of N2 programming iterations for the set, following the N1 programming iterations, applying a program pulse, performing a verify operation using the offset verify level, and performing a verify operation using the final verify level.

In another embodiment, a non-volatile storage system includes a set of non-volatile storage elements, and at least one control circuit. The at least one control circuit, to perform a plurality of programming iterations of a programming operation for the set of storage elements in a non-volatile storage system: (a) for each of N2 programming iterations for the set, applies a program pulse, performs a verify operation using an offset verify level for a data state, the offset verify level is offset from a final verify level for the data state, and performs a verify operation using the final verify level, and (b) for each of N3 programming iterations for the set, following the N2 programming iterations, applies a program pulse, and performs a verify operation using the final verify level, without performing a verify operation using the offset verify level.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for performing a plurality of programming iterations of a programming operation for a set of storage elements in a non-volatile storage system, comprising:

for each of N2 programming iterations for the set, applying a program pulse to the set of storage elements, each storage element in the set of storage elements has a common target data state and a respective threshold voltage, performing a verify operation to identify storage elements in the set whose respective threshold voltage exceeds an offset verify level for the common target data state, the offset verify level is offset from a final verify level for the common target data state, and performing a verify operation to identify storage elements in the set whose respective threshold voltage exceeds the final verify level;

determining when a condition is met to stop using the verify operation to identify storage elements in the set whose respective threshold voltage exceeds the offset verify level, the condition is met when the respective threshold voltages of most of the storage elements have reached the offset verify level; and when the condition is met: for each of N3 programming iterations for the set, following the N2 programming iterations, applying a program pulse to the set of storage elements, and performing a verify operation to identify storage elements in the set whose respective threshold voltage exceeds the final verify level, without performing a verify operation to identify storage elements in the set whose respective threshold voltage exceeds the offset verify level.

2. The method of claim 1, wherein:

the determining when the condition is met comprises determining when respective threshold voltages of a specified portion of the storage elements reach the offset verify level.

3. The method of claim 1, further comprising:

identifying a sample of storage elements in the set of storage elements; and determining a number of storage elements in the sample which have respective threshold voltages which have reached the offset verify level, the condition is met if the number exceeds a threshold.

4. The method of claim 1, further comprising:
identifying a sample of storage elements in the set of storage elements; and
determining a number of storage elements in the sample which have respective threshold voltages which have reached the offset verify level, the condition is met if the number exceeds a threshold.

5. The method of claim 1, wherein:
the determining when the condition is met comprises determining when a predetermined number of storage elements in the set of storage elements whose respective threshold voltages have not reached the offset verify level, is below a threshold number.

6. The method of claim 1, further comprising:
the determining when the condition is met comprises identifying a sample of storage elements in the set of storage elements; and
determining a number of storage elements in the sample which have respective threshold voltages which have not reached the offset verify level, the condition is met if the number falls below a threshold number.

7. The method of claim 1, further comprising:
for each of N1 programming iterations for the set, prior to the N2 programming iterations, applying a program pulse, and performing the verify operation to identify storage elements in the set whose respective threshold voltage exceeds the final verify level, but not performing the verify operation to identify storage elements in the set whose respective threshold voltage exceeds the offset verify level.

8. The method of claim 7, wherein:
a first programming iteration of the N2 programming iterations begins a predetermined number of programming iterations after a first programming iteration of the N1 programming iterations begins.

9. The method of claim 7, further comprising:
determining when at least a predetermined number of storage elements in the set of storage elements are locked out from further programming at the final verify level; and
based on the determining, starting a first programming iteration of the N2 programming iterations.

10. The method of claim 7, further comprising:
identifying a sample of storage elements in the set of storage elements;
determining a number of storage elements in the sample which have respective threshold voltages which have reached the final verify level; and
if the number exceeds a threshold, starting a first programming iteration of the N2 programming iterations.

11. The method of claim 1, further comprising:
performing at least one programming iteration for the set before the N2 programming iterations, in which a program pulse is applied, but not performing the verify operation to identify storage elements in the set whose respective threshold voltage exceeds the offset verify level, and not performing the verify operation to identify storage elements in the set whose respective threshold voltage exceeds the final verify level.

12. The method of claim 1, wherein:
the program pulses, the offset verify level and the final verify level are applied to a word line which is in communication with the set of storage elements.

13. A method for performing a plurality of programming iterations of a programming operation for a set of storage elements in a non-volatile storage system, comprising:
for each of N1 programming iterations for the set, applying a program pulse to the set of storage elements, each storage element in the set of storage elements has a common target data state and a respective threshold voltage, and performing a verify operation to identify storage elements in the set whose respective threshold voltage exceeds a final verify level for the common target data state, but not performing a verify operation to identify storage elements in the set whose respective threshold voltage exceeds an offset verify level for the common target data state, the offset verify level is offset from the final verify level;
determining when a condition is met for starting to use the verify operation to identify storage elements in the set whose respective threshold voltage exceeds the offset verify level, the condition is met when the respective threshold voltages of some of the storage elements have reached the final verify level; and
when the condition is met: for each of N2 programming iterations for the set, following the N1 programming iterations, applying a program pulse to the set of storage elements, performing the verify operation to identify storage elements in the set whose respective threshold voltage exceeds the offset verify level, and performing the verify operation to identify storage elements in the set whose respective threshold voltage exceeds the final verify level.

14. The method of claim 13, further comprising:
performing at least one programming iteration for the set before the N1 programming iterations, in which a program pulse is applied to the set of storage elements, but not performing the verify operation to identify storage elements in the set whose respective threshold voltage exceeds the offset verify level, and not performing the verify operation to identify storage elements in the set whose respective threshold voltage exceeds the final verify level.

15. The method of claim 13, wherein:
a first programming iteration of the N2 programming iterations begins a predetermined number of programming iterations after a first programming iteration of the N1 programming iterations begins.

16. The method of claim 13, wherein:
the determining when the condition is met comprises determining when at least a predetermined number of storage elements in the set of storage elements are locked out from further programming at the final verify level.

17. The method of claim 13, further comprising:
identifying a sample of storage elements in the set of storage elements; and
the method further comprises determining a number of storage elements in the sample which have respective threshold voltages which have reached the final verify level, the condition is met if the number exceeds a threshold.

18. A non-volatile storage system, comprising:
a set of non-volatile storage elements, each storage element in the set of storage elements has a common target data state and a respective threshold voltage; and
at least one control circuit, the at least one control circuit, to perform a plurality of programming iterations of a programming operation for the set of storage elements in a non-volatile storage system: (a) for each of N2 programming iterations for the set, applies a program pulse to the set of storage elements, performs a verify operation to identify storage elements in the set whose respective threshold voltage exceeds an offset verify level for the common target data state, the offset verify level is offset from a final verify level for the common target data state, and performs a verify operation to identify storage elements in the set whose respective threshold voltage exceeds the final verify level, (b) determines when a condition is met to stop using the verify operation to identify storage elements in the set whose respective threshold voltage exceeds the offset verify level, the condition is met when the respective threshold voltages of most of the storage elements have reached the offset verify level and (c) when the condition is met: for each of N3 programming iterations for the set, following the N2 programming iterations, applies a program pulse to the set of storage elements, and performs the verify operation to identify storage elements in the set whose respective threshold voltage exceeds the final verify level, but does not perform the verify operation to identify storage elements in the set whose respective threshold voltage exceeds the offset verify level.

19. The non-volatile storage system of claim 18, wherein:

to determine when the condition is met, the at least one control circuit determines when respective threshold voltages of a specified portion of storage elements in the set of storage elements reach the offset verify level.

20. The non-volatile storage system of claim 18, wherein:

to determine when the condition is met, the at least one control circuit determines when a predetermined number of storage elements whose respective threshold voltages have not reached the offset verify level, is below a threshold number.

21. The non-volatile storage system of claim 18, wherein:

the at least one control circuit starts a first programming iteration of the N2 programming iterations when a predetermined number of storage elements in the set of storage elements are locked out from further programming at the final verify level.

22. The non-volatile storage system of claim 18, wherein:

the at least one control circuit performs at least one programming iteration for the set before the N2 programming iterations, in which a program pulse is applied to the set of storage elements, but the verify operation to identify storage elements in the set whose respective threshold voltage exceeds the offset verify level is not performed, and the verify operation to identify storage elements in the set whose respective threshold voltage exceeds the final verify level is not performed.

23. The non-volatile storage system of claim 18, further comprising:

a word line which is in communication with the set of storage elements, the program pulses, the offset verify level and the final verify level are applied to the word line.

24. A non-volatile storage system, comprising:

a set of non-volatile storage elements, each storage element in the set of storage elements has a common target data state and a respective threshold voltage; and at least one control circuit, the at least one control circuit, to perform a plurality of programming iterations of a programming operation for the set of storage elements in a non-volatile storage system: (a) for each of N1 programming iterations for the set, applies a program pulse to the set of storage elements, performs a verify operation to identify storage elements in the set whose respective threshold voltage exceeds a final verify level for the common target data state, but does not perform a verify operation to identify storage elements in the set whose respective threshold voltage exceeds the offset verify level, the offset verify level is offset from the final verify level, (b) determining when a condition is met to start to use the verify operation to identify storage elements in the set whose respective threshold voltage exceeds the offset verify level, the condition is met when the respective threshold voltages of some of the storage elements have reached the final verify level and (b) when the condition is met: for each of N2 programming iterations for the set, following the N1 programming iterations, applies a program pulse to the set of storage elements, performs the verify operation to identify storage elements in the set whose respective threshold voltage exceeds the offset verify level, and performs the verify operation to identify storage elements in the set whose respective threshold voltage exceeds the final verify level.

25. The non-volatile storage system of claim 24, wherein:

the at least one control circuit performs at least one programming iteration for the set before the N1 programming iterations, in which a program pulse is applied to the word line, but the verify operation to identify storage elements in the set whose respective threshold voltage exceeds the offset verify level is not performed, and the verify operation to identify storage elements in the set whose respective threshold voltage exceeds the final verify level is not performed.

26. The non-volatile storage system of claim 24, wherein:

the condition is met when a predetermined number of programming iterations have occurred after a first programming iteration of the N1 programming iterations begins.

27. The non-volatile storage system of claim 24, wherein:

the condition is met when a predetermined number of storage elements in the set of storage elements are locked out from further programming at the final verify level.

* * * * *